US009318604B2

(12) United States Patent
Kwon

(10) Patent No.: US 9,318,604 B2
(45) Date of Patent: Apr. 19, 2016

(54) SEMICONDUCTOR DEVICE INCLUDING A GATE ELECTRODE

(71) Applicant: SK hynix Inc., Icheon (KR)

(72) Inventor: Il Woong Kwon, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/615,377

(22) Filed: Feb. 5, 2015

(65) Prior Publication Data

US 2016/0027915 A1    Jan. 28, 2016

(30) Foreign Application Priority Data

Jul. 24, 2014  (KR) .......................... 10-2014-0094121

(51) Int. Cl.
| H01L 27/108 | (2006.01) |
| H01L 29/76 | (2006.01) |
| H01L 29/94 | (2006.01) |
| H01L 31/119 | (2006.01) |
| H01L 29/78 | (2006.01) |

(Continued)

(52) U.S. Cl.
CPC .......... *H01L 29/7827* (2013.01); *H01L 27/088* (2013.01); *H01L 27/10802* (2013.01); *H01L 29/4236* (2013.01); *H01L 29/7841* (2013.01)

(58) Field of Classification Search
CPC ..................... H01L 21/0228; H01L 21/02614; H01L 21/041; H01L 21/02576; H01L 21/02579; H01L 21/048; H01L 21/0214; H01L 21/31683; H01L 21/308; H01L 21/475; H01L 21/3212; H01L 21/762; H01L 21/8229; H01L 27/0629; H01L 27/3248; H01L 28/40; H01L 29/76; H01L 29/7816
USPC .......... 257/68, 296, 396, 213, 298, 300, 301, 257/310, 340, 351, 382, 410, 411, 634, 701, 257/760, 774, E21.006, E21.016, E21.023, 257/E21.045, E21.051, E21.056, E21.126, 257/E21.127, E21.17, E21.23, E21.231, 257/E21.247, E21.267, E21.278, E21.293, 257/E21.304, E21.564, E21.577, E21.646
See application file for complete search history.

(56) References Cited

U.S. PATENT DOCUMENTS

| 7,176,080 B2 * | 2/2007 | Kawabata | ........... H01L 27/1087 438/238 |
| 7,361,933 B2 * | 4/2008 | Kawabata | ........... H01L 27/1087 257/68 |
| 8,492,832 B2 * | 7/2013 | Kim | ..................... H01L 29/4236 257/331 |

(Continued)

FOREIGN PATENT DOCUMENTS

| KR | 10-2008-0051014 A | 6/2008 |
| KR | 10-2011-0109752 A | 10/2011 |

(Continued)

*Primary Examiner* — David Nhu

(57) ABSTRACT

A semiconductor device includes a plurality of first gate electrodes buried in a semiconductor substrate including an active region and a device isolation film, a plurality of junction regions including storage node junction regions and a bit line junction region disposed between the storage node junction regions, a plurality of storage node contact plugs respectively disposed over and coupled to the storage node junction regions, a plurality of storage nodes respectively disposed over and coupled to the storage node contact plugs, and a second gate electrode disposed over a sidewall of a corresponding one of the storage node contact plugs. A vertical transistor includes the second gate electrode and the corresponding storage node contact plug and stores charges leaked from a corresponding one of the storage nodes.

20 Claims, 37 Drawing Sheets

(51) Int. Cl.
*H01L 29/423* (2006.01)
*H01L 27/088* (2006.01)

(56) References Cited

U.S. PATENT DOCUMENTS 8,716,769 B2 * 5/2014 Ihara .................... H01L 27/1461
257/291
8,853,032 B2 * 10/2014 Lee ..................... H01L 29/1041
438/270

2011/0241106 A1 10/2011 Lee et al.
2013/0037882 A1 2/2013 Kim et al.
2013/0175582 A1 7/2013 Ihara et al.
2013/0248989 A1 9/2013 Lee et al.
2014/0374822 A1 12/2014 Lee et al.

FOREIGN PATENT DOCUMENTS

KR 10-2013-0017911 A 2/2013
KR 10-2013-0081953 A 7/2013
KR 10-2013-0107490 A 10/2013

* cited by examiner

SEMICONDUCTOR DEVICE INCLUDING A GATE ELECTRODE

CROSS-REFERENCE TO RELATED APPLICATION

The priority to Korean Patent Application No. 10-2014-0094121 filed on 24 Jul. 2014, the disclosure of which is hereby incorporated in its entirety by reference, is claimed.

BACKGROUND

Embodiments of the present disclosure relate to a semiconductor device, and more particularly to a semiconductor device that includes a gate electrode.

Generally, a semiconductor material has intermediate electrical conductivity between a conductor and a nonconductor. Although a semiconductor material acts as a nonconductor in a pure state, electrical conductivity of the semiconductor material is increased by introducing impurities into the semiconductor material through, e.g., ion implantation, diffusion, or the like. The semiconductor material is used to fabricate a semiconductor device such as a transistor. For example, the semiconductor device includes a semiconductor memory device.

A semiconductor memory device includes a plurality of transistors. The transistor has three regions, i.e., a gate, a source, and a drain. Electric charges move between the source and the drain through a channel region, according to a voltage level of a control signal input to the gate of the transistor.

As a semiconductor device is reduced in size, cell capacitance (Cs) is also reduced, which leads to decrease in a retention time. Since the cell capacitance (Cs) is reduced, although substantially the same bias is applied to the semiconductor device, an amount of charges stored in the semiconductor device may be reduced.

SUMMARY

Various embodiments of the present disclosure are directed to providing a semiconductor device that addresses one or more problems of the related art.

An embodiment of the present disclosure relates to a semiconductor device including a gate structure that is capable of storing charges leaked from a cell capacitor so as to minimize the loss of charges, resulting in improvement of characteristics of the semiconductor device.

In accordance with an aspect of an embodiment, a semiconductor device includes: a plurality of first gate electrodes buried in a semiconductor substrate including an active region and a device isolation film; a plurality of junction regions, each of the junction regions disposed in a portion of the active region between two adjacent first gate electrodes, the junction regions including storage node junction regions and a bit line junction region disposed between the storage node junction regions; a plurality of storage node contact plugs disposed over and coupled to the storage node junction regions, respectively; a plurality of storage nodes coupled to and disposed over the storage node contact plugs, respectively; and a second gate electrode disposed over a sidewall of a corresponding one of the storage node contact plugs, wherein a vertical transistor includes the second gate electrode and the corresponding storage node contact plug and stores charges leaked from a corresponding one of the storage nodes.

A sidewall of a junction region partially overlaps with a sidewall of a corresponding one of the first gate electrodes.

The junction regions include N-type impurities.

The first gate electrodes and the second gate electrode each include a gate insulation film and a barrier metal layer.

The storage node contact plugs include an N-type polysilicon layer, a silicon epitaxial layer, or both.

Each of the storage node contact plugs includes an n-p-n structure in which a first N-type layer, a P-type body, and a second N-type layer are disposed.

The P-type body is disposed between the first and second N-type layers and includes P-type impurities.

The second gate electrode is disposed over a first sidewall of the P-type body of the n-p-n structure.

The storage node contact plugs include: a first storage node contact plug coupled to a first one of the storage node junction regions; and a second storage node contact plug coupled to a second one of the storage node junction regions, and wherein the second gate electrode disposed over a sidewall of the first storage node contact plug is isolated from the second gate electrode disposed over a sidewall of the second storage node contact plug.

A bit line coupled to the bit line junction region and including a bit-line contact pattern and a bit-line conductive pattern that are sequentially stacked over the bit line junction region.

In accordance with another aspect of an embodiment, semiconductor device include: a plurality of first gate electrodes buried in a semiconductor substrate including an active region and a device isolation film; a plurality of junction regions, each of the junction regions disposed in a portion of the active region between two adjacent first gate electrodes, the plurality of junction regions including storage node junction regions and a bit line junction region disposed between the storage node junction regions; a plurality of storage node contact plugs disposed over and coupled to the storage node junction regions, respectively; a plurality of storage nodes coupled to and disposed over the storage node contact plugs, respectively; and a plurality of second gate electrodes disposed over the first gate electrodes, respectively, and configured to prevent leakage charges of the storage nodes disposed in the active region, wherein each of the first gate electrodes and a corresponding one of the second gate electrodes are isolated from each other by an insulation film pattern.

The junction regions include N-type impurities.

Each of the junction regions includes an n-p-n structure in which a first N-type junction region, a P-type junction region, and a second N-type junction region are disposed.

The P-type junction region is disposed between the first and second N-type junction regions and includes P-type impurities.

A sidewall of the first N-type junction region overlaps with a sidewall of the insulation film pattern.

A sidewall of the P-type junction region overlaps with a sidewall of the second gate electrode. Each of the first gate electrodes and each of the second gate electrodes include a gate insulation film and a barrier metal layer. The storage node contact plugs include an N-type polysilicon layer.

The semiconductor device further comprises: a bit line coupled to the bit line junction region and including a bit-line contact pattern and a bit-line conductive pattern that are sequentially stacked over the bit line junction region.

In accordance with another aspect of an embodiment, a semiconductor device comprises: two adjacent first gate electrodes, one of the first gate electrodes buried in an active region and the other one of the first gate electrodes buried in a device isolation film defining the active region in a semiconductor substrate; a storage node contact junction region disposed in a portion of the active region that is disposed between the first gate electrodes; a storage node contact plug disposed over the storage node contact junction region and including a first N-type pattern, a P-type body, and a second N-type pattern; a storage node disposed over the storage node contact plug; and a second gate electrode disposed over a sidewall of the P-type body.

It is to be understood that both the foregoing general description and the following detailed description of embodiments are not limiting, but are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1A:
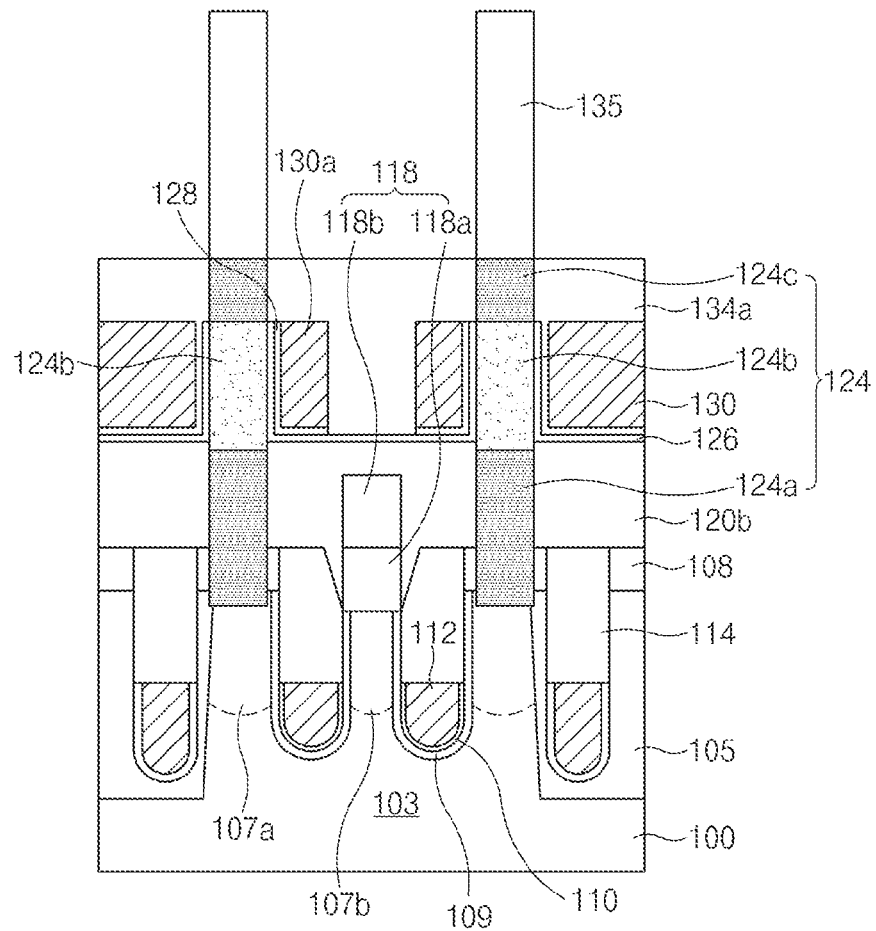
FIGS. 1A and 1B illustrate a semiconductor device according to a first embodiment of the present disclosure.
Figure 1B:
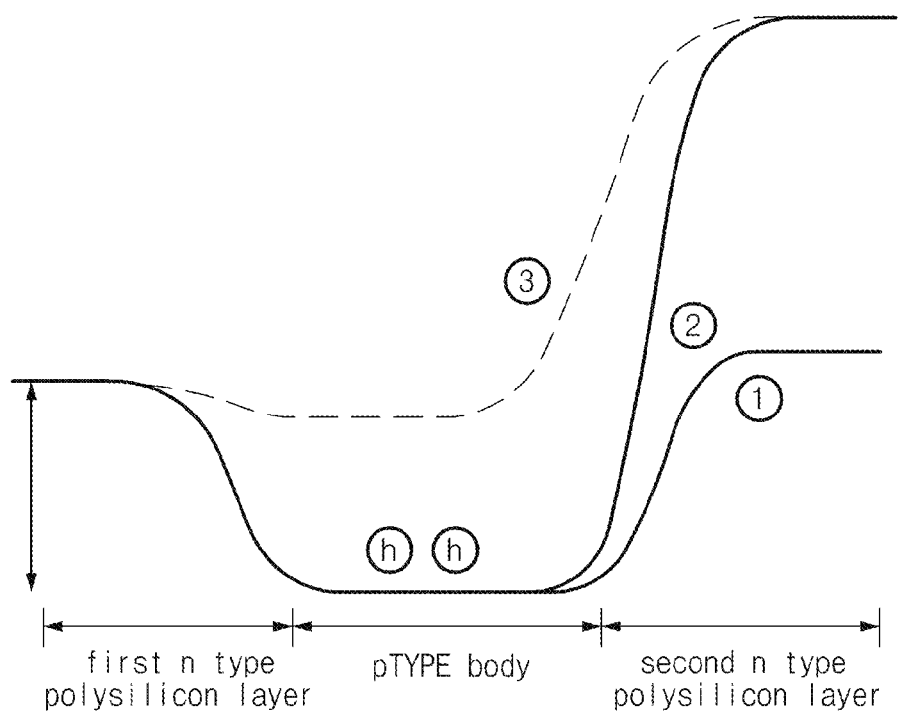

FIGS. 1A and 1B illustrate a semiconductor device according to a first embodiment of the present disclosure.

Referring to FIG. 1A, a plurality of first gate electrodes 112 is buried in a semiconductor substrate 100 including an active region 103 and device isolation films 105. A gate insulation film 109 and a barrier metal layer 110 may be disposed under the first gate electrode 112 in the active region 103. Here, the active region 103 may be formed of a P-type material. Two first gate electrodes 112 are disposed in the active region 103, and one first gate electrodes 112 is disposed in a corresponding one of the device isolation films 105. A sealing film 114 is disposed over the first gate electrodes 112 so that the first gate electrodes 112 can be electrically isolated from each other.

A bit-line junction region 107b is disposed in an upper portion of the active region 103 between the two first gate electrodes 112 disposed in the active region 103. A storage node junction region 107a is disposed in an upper portion of the active region 103 between each of the two first gate electrodes 112 and a neighboring first gate electrode 112 buried in a corresponding one of the device isolation films 105. The bit-line junction region 107b and the storage node junction region 107a may be formed by implanting N-type impurities, which have an opposite conductive type to P-type impurities in the active region 103. Although the junction regions 107a and 107b include the N-type impurities in this embodiment, embodiments are not limited thereto. In another embodiment, P-type impurities may be implanted to form the junction regions 107a and 107b.

In addition, a bit line 118 is formed over and coupled to the bit-line junction region 107b. The bit line 118 may have a stacked structure, which includes a bit-line contact pattern 118a and a bit-line conductive pattern 118b.

In addition, a storage node contact plug 124 coupled to the storage node junction region 107a is formed over the storage node junction region 107a. The storage node contact plug 124 may include an n-p-n structure in which a first N-type polysilicon layer 124a (also referred to herein as a first N-type polysilicon pattern), a P-type body 124b, and a second N-type polysilicon layer 124c (also referred to herein as a second N-type polysilicon pattern) are sequentially stacked. In an embodiment, the P-type body 124b may be formed by forming an N-type polysilicon layer over the storage node junction region 107a and implanting P-type impurities into a middle portion of the N-type polysilicon layer, and thus the first and second N-type polysilicon layers 124a and 124c are separate from each other by the P-type body 124b.

In addition, a gate insulation film 126 and a barrier metal layer 128 are disposed at one side of the P-type body 124b of the storage node contact plug 124, and a second gate electrode 130a is disposed over the barrier metal layer 128. The n-p-n type storage node contact plug 124 and the second gate electrode 130a may act as a vertical transistor. In addition, a storage node 135 is formed over and coupled to the storage node contact plug 124. The storage node 135 may have a cylindrical or concave shape. However, the shape of the storage node 135 is not limited thereto, and the storage node 135 may have another shape.

As described above, the semiconductor device according to the first embodiment includes the storage node contact plug 124 having an n-p-n structure. The second gate electrode 130a may be formed on a sidewall of the P-type body 124b of the n-p-n structure. Therefore, a vertical transistor includes the second gate electrode 130a and the storage node contact plug 124. Charges leaked from the storage node 135 can be accumulated in the vertical transistor using floating body characteristics of the vertical transistor.

According to the first embodiment, when some charges stored in a cell capacitor 135 are leaked, the leaked charges are accumulated in the P-type body 124b of the storage node contact plug 124 of the vertical transistor, which has floating body characteristics. During a read operation, since the accumulated charges in the P-type body 124b are sensed with the remaining charges in the cell capacitor 135, a retention time of the semiconductor device according to the first embodiment may be substantially prevented from being decreased due to the leakage. As a result, the semiconductor device according to the first embodiment can have substantially the same effect as preventing the occurrence of leakage charges from the cell capacitor 135.

In an embodiment, the second gate electrode 130a of the vertical transistor operates using substantially the same operation voltage at substantially the same operation time as those of the first gate electrode 112 of a cell transistor. For example, during a write operation, if the first gate electrode 112 and the second gate electrode 130a are simultaneously turned on, charges flow through the bit-line junction region 107b, a channel region under the first gate electrode 112, and the storage node junction region 107a to the first and second N-type polysilicon layers 124a and 124c. Thereafter, the first gate electrode 112 and the second gate electrode 130a are simultaneously turned off. During a read operation, charges flow in a reverse direction of that in the write operation.

A potential of the storage node contact plug 124 of the vertical transistor will be described with reference to FIG. 1B. In an initial state, a first potential difference (also referred to herein as a potential barrier) between the first N-type polysilicon layer 124a and the P-type body 124b, and a second potential difference between the P-type body 124b and the second N-type polysilicon layer 124c are formed as shown in ① of FIG. 1B. When charges are stored in a cell capacitor, the potential difference across a junction region between the second N-type polysilicon layer 124c and the p-type body 124b increases as shown in ②. Thus, some of the charges stored in the cell capacitor may be leaked out from the cell capacitor through the second N-type polysilicon layer 124c to the p-type body 124b due to a junction leakage between the second N-type polysilicon layer 124c and the P-type body 124b and Gate Induced Drain Leakage (GIDL) between the second N-type polysilicon layer 124c and the second gate electrode 130a.

However, due to the potential barrier across the junction region between the first N-type polysilicon layer 124a and the P-type body 124b, the leaked charges are accumulated in a floated portion of the P-type body 124b, as indicated by the symbol 'h' of FIG. 1B. As the leaked charges are accumulated in the floated portion, the potential of the floated portion of the P-type body 124b increases as shown in ③ of FIG. 1B. As a result, an electric field between the second N-type polysilicon layer 124c and the P-type body 124b is reduced to suppress remaining charges in the cell capacitor from leaking to the P-type body 124b. When the potential of the floated portion of the P-type body 124b becomes higher, some of the accumulated charges may migrate to the N-type polysilicon layer 124a. However, at this time, a junction region between the first N-type polysilicon layer 124a and the P-type body 124b acts as a barrier. That is, according to the above-mentioned principles, the first embodiment can accumulate leakage charges from the cell capacitor in the storage node contact plug 124.

Figure 2A:
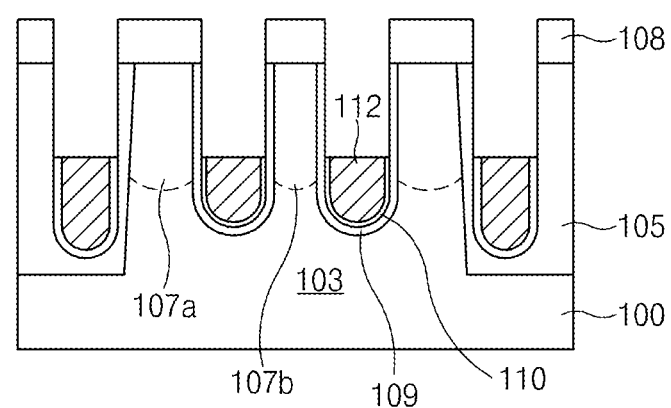
FIGS. 2A to 2N are cross-sectional views illustrating a method for forming the semiconductor device shown in FIG. 1A according to an embodiment of the present disclosure.
Figure 2B:
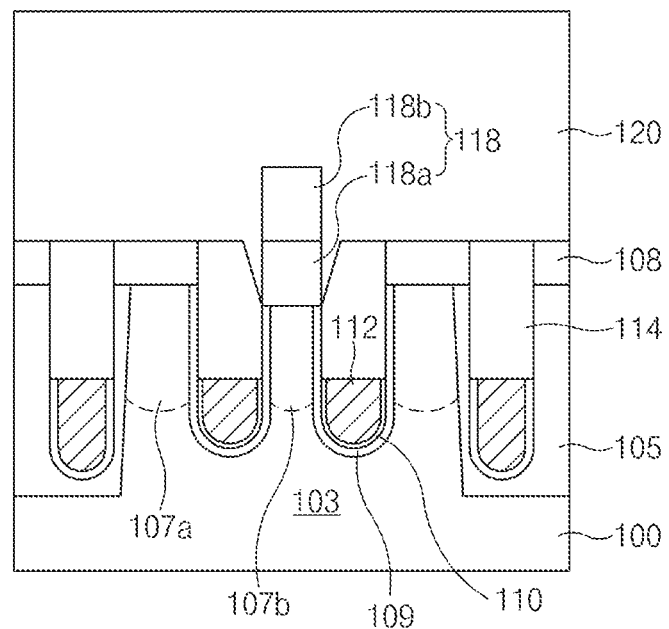
Figure 2C:
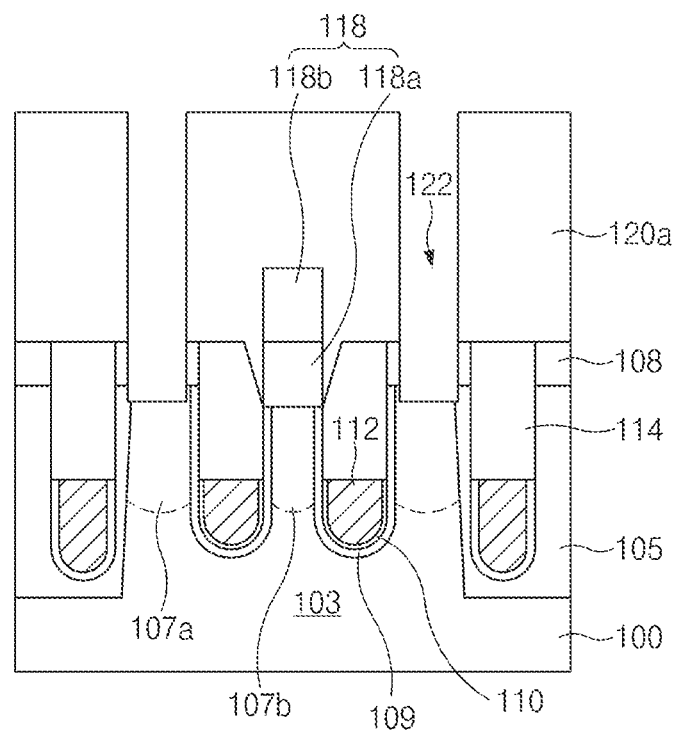
Figure 2D:
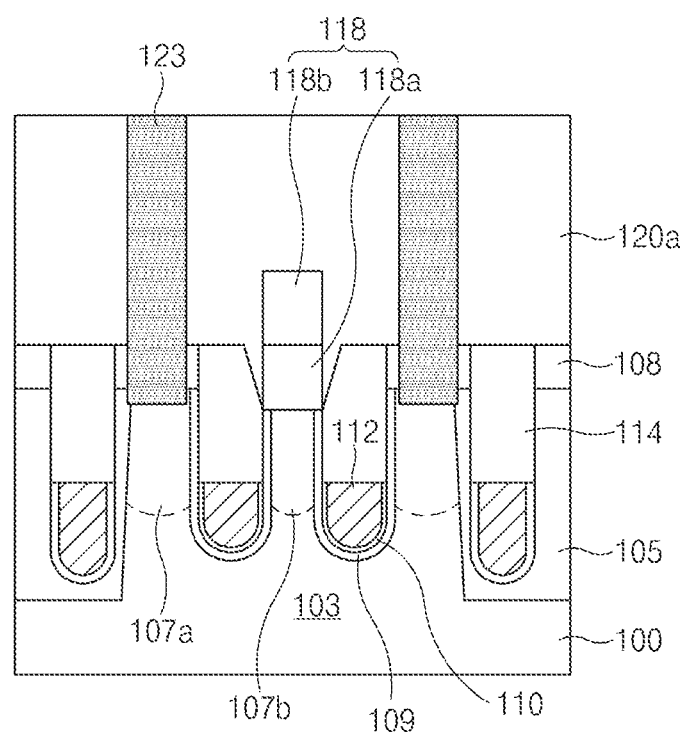
Figure 2E:
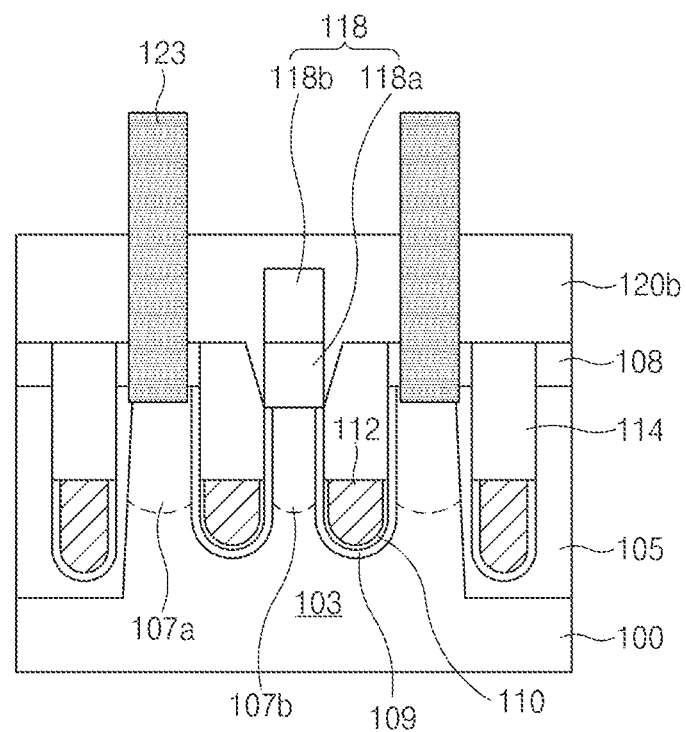
Figure 2F:
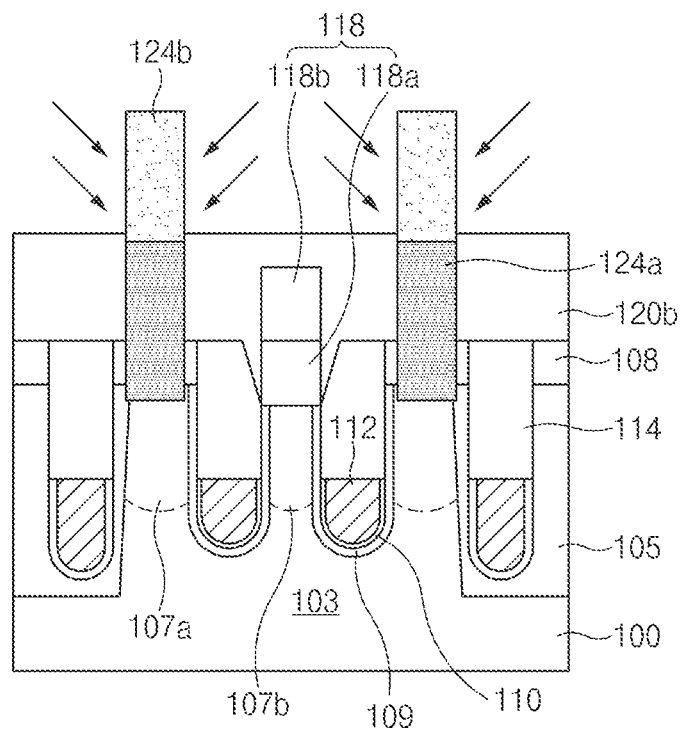
Figure 2G:
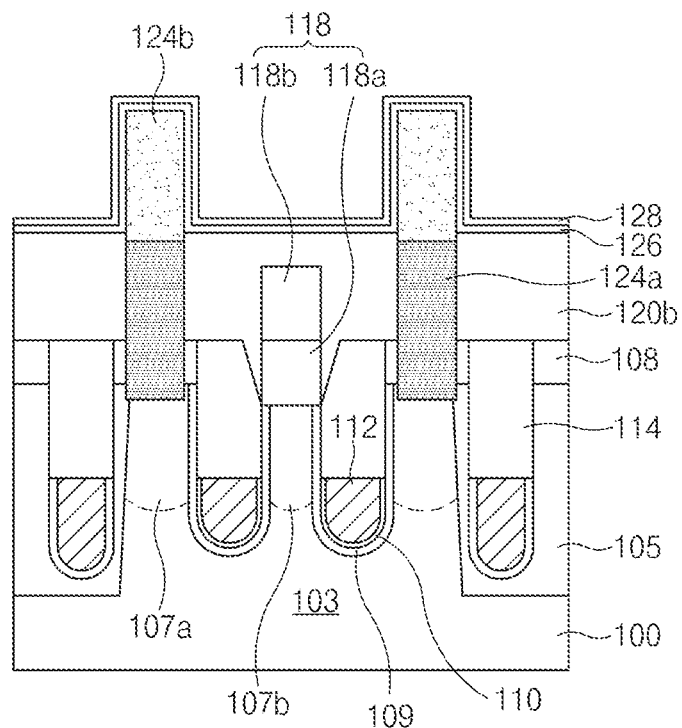
Figure 2H:
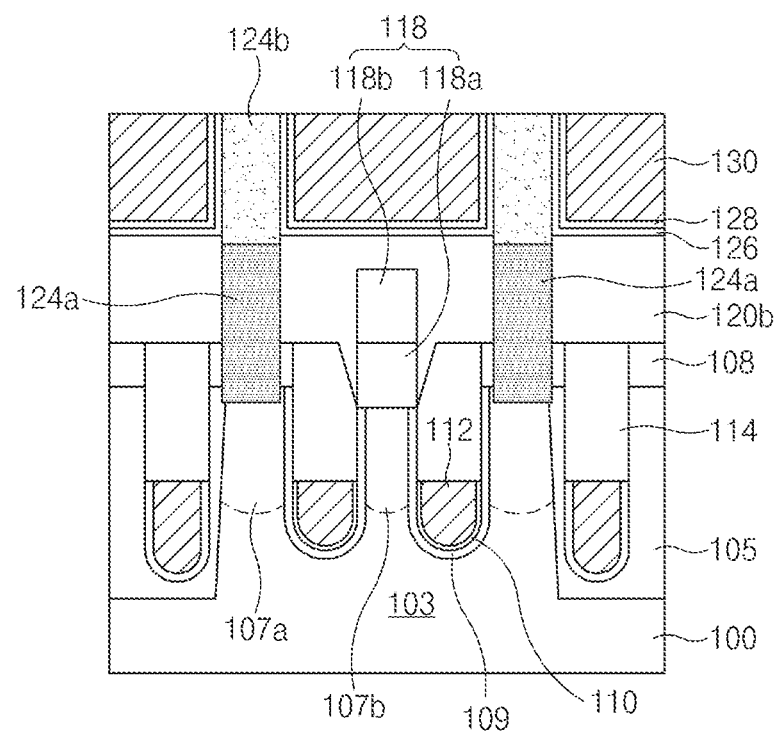
Figure 2I:
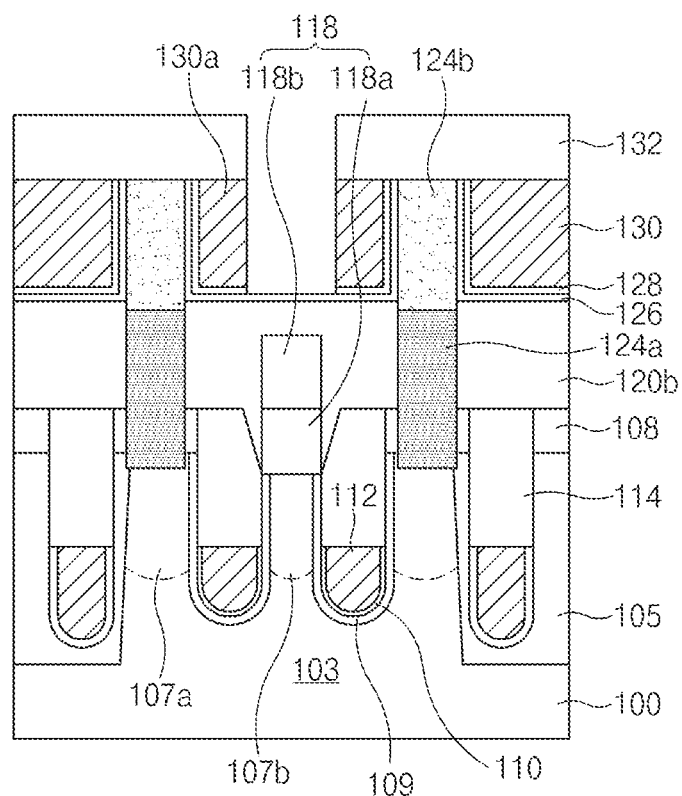
Figure 2J:
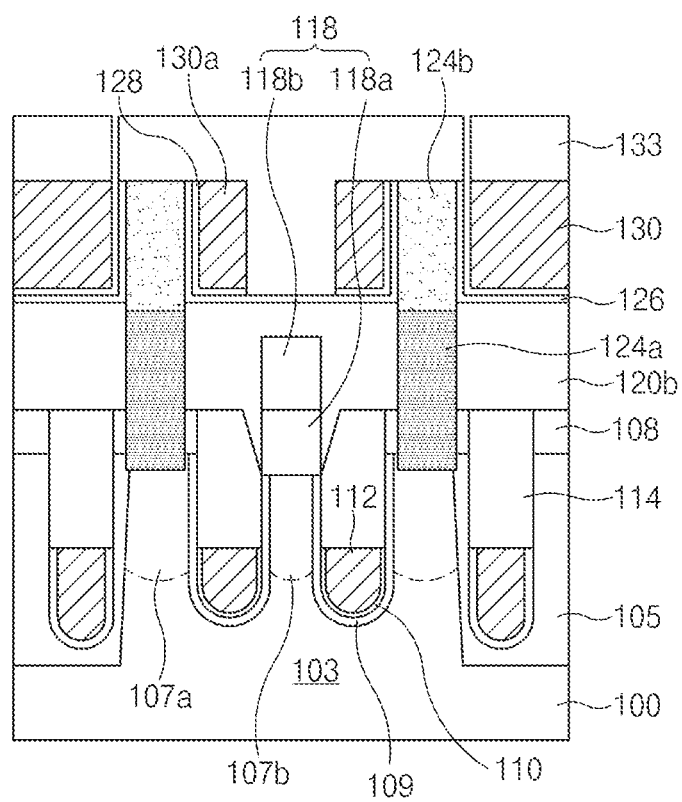
Figure 2K:
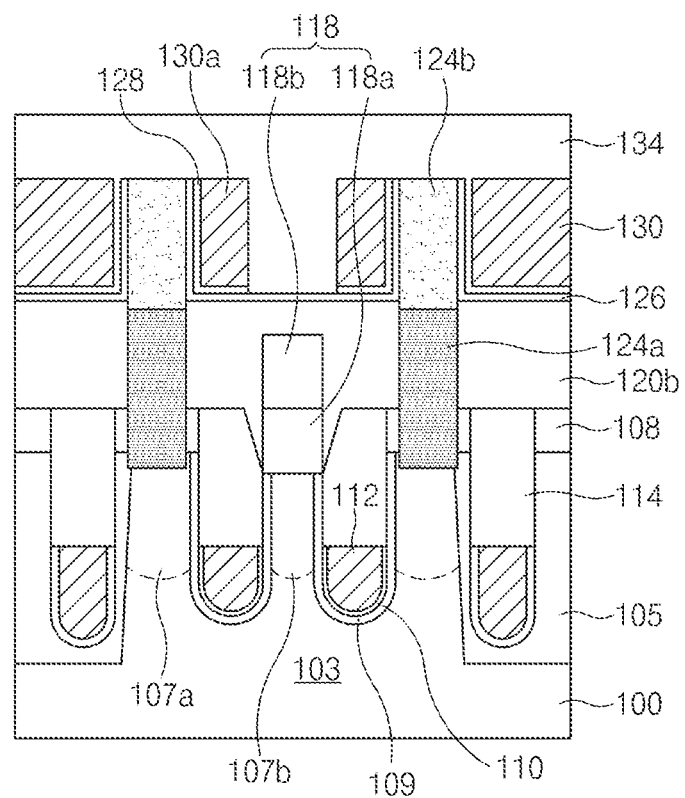
Figure 2L:
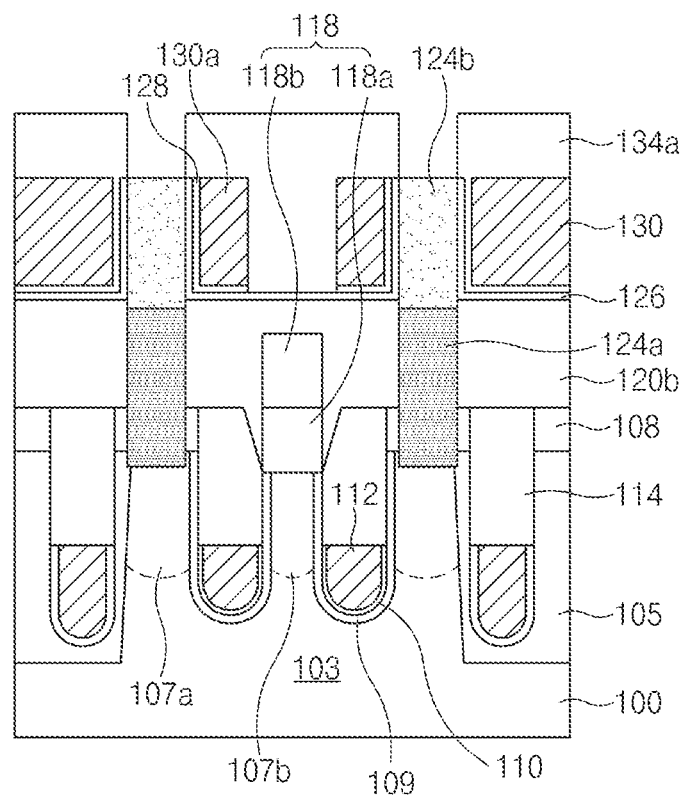
Figure 2M:
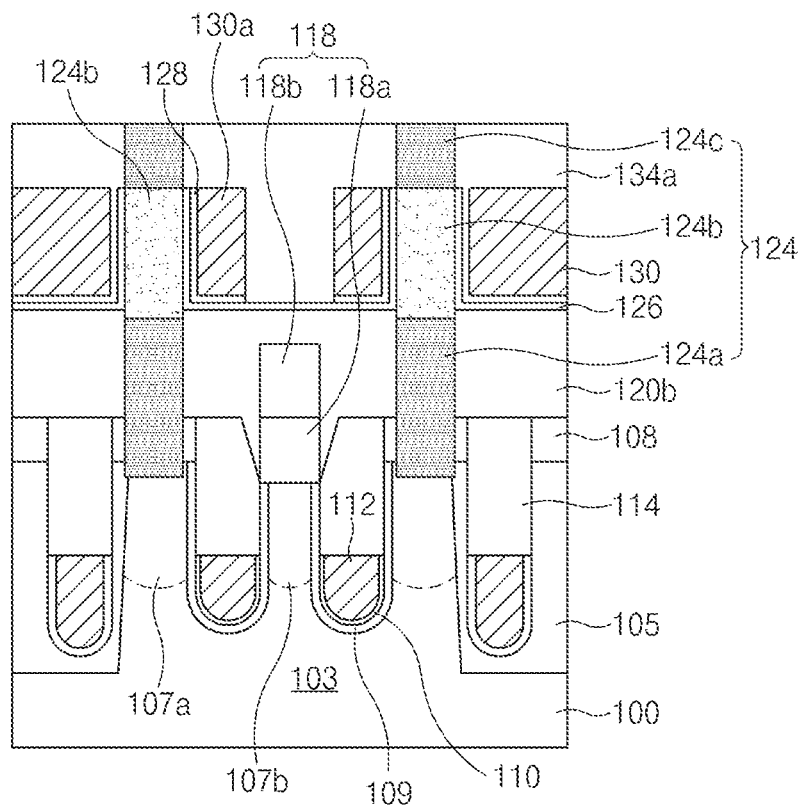
Figure 2N:
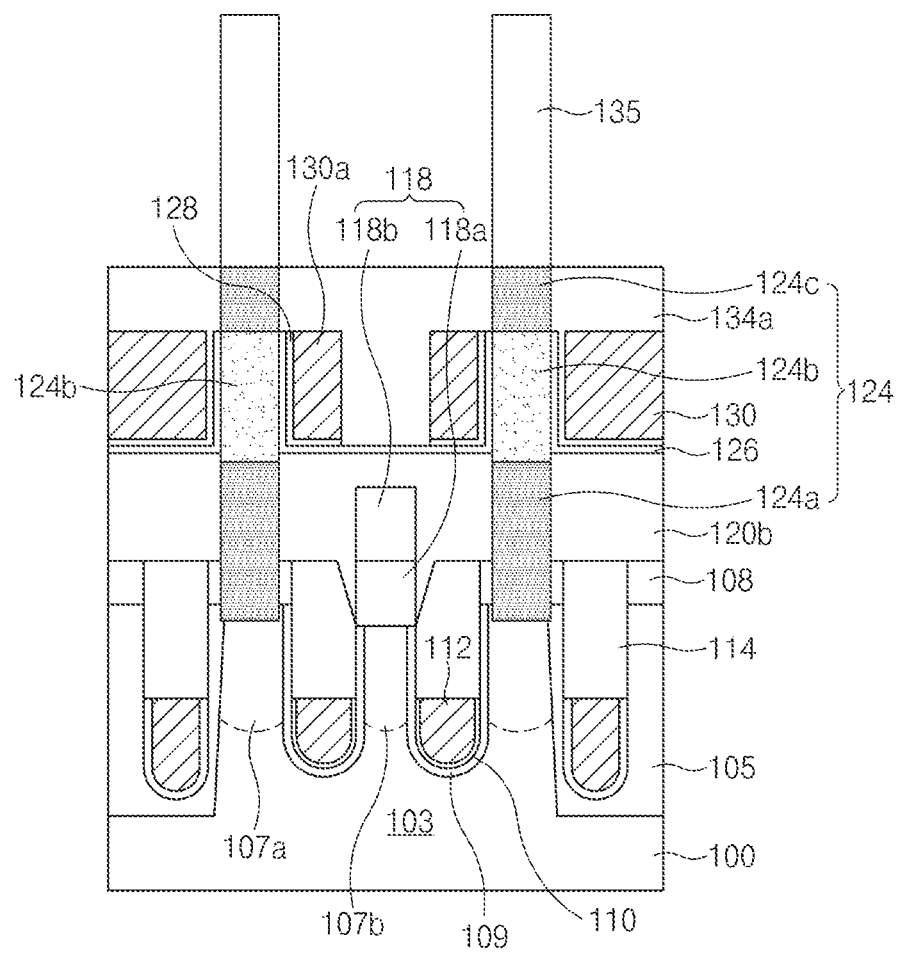

FIGS. 2A to 2N are cross-sectional views illustrating a method for forming the semiconductor device shown in FIG. 1A according to an embodiment of the present disclosure.

Referring to FIG. 2A, a pad oxide film (not shown) and a pad nitride film (not shown) are formed over a semiconductor substrate 100. Subsequently, a photoresist pattern (not shown) defining an active region is formed over the pad nitride film using a photolithographic process of a Shallow Trench Isolation (STI) method.

The pad nitride film and the pad oxide film are sequentially etched using the photoresist pattern as an etch mask to form a mask pattern (not shown). Thereafter, a device-isolation trench defining an active region 103 is formed by etching the semiconductor substrate 100 using the mask pattern as an etch mask.

Subsequently, a sidewall insulation film (not shown) is formed on an inner surface of the device-isolation trench. After that, an insulation film is formed to fill the remaining portion of the device-isolation trench, the insulation film is planarized (e.g. using a Chemical Mechanical Polishing (CMP) process) to form a device isolation film 105 defining the active region 103. The device isolation film 105 may include at least one of a Boro-phospho Silicate Glass (BPSG) film, a Phosphorous Silicate Glass (PSG) film, a Spin On Glass (SOG) film, a Polysilazane (PSZ) film, an O3-TEOS (Tetrahydroxysilane) film, a High Density Plasma (HDP) oxide film, and an Atomic Layer Deposition (ALD) film.

Subsequently, ion implantation is performed on the active region 103 to form a junction region. When the active region 103 is formed of a P-type silicon material, N-type ions that are the opposite conductive type to the P-type impurities of the active region 103 are implanted into an upper portion of the active region 103 to form an N-type junction region.

After that, a hard mask layer (not shown) is formed over a resulting structure including the N-type junction region, and a photoresist pattern (not shown) defining a gate region is formed over the hard mask layer. Subsequently, the hard mask layer is etched using the photoresist pattern as an etch mask to form a hard mask pattern 108.

Thereafter, the device isolation film 105 and the active region 103 are etched to predetermined depths using the hard mask pattern 108 as an etch mask, so that a plurality of recesses is formed to define gate regions. The recesses may be formed in both of the active region 103 and the device isolation film 105. As a result, storage node junction regions 107a and a bit line junction region 107b are formed in the active region 103 to be separated from each other by the recesses. In an embodiment, an etch rate of the active region 103 may be lower than an etch rate of the device isolation film 105, and thus a depth of a recess formed in the active region 103 may be smaller than a depth of a recess formed in the device isolation film 105, as shown in FIG. 2A.

Thereafter, a gate insulation film 109 is formed along a surface of the recesses. In an embodiment, after a silicon oxide ($SiO_2$) film is formed at an inner surface of the gate recess using a radical oxidation process, the $SiO_2$ film is selectively etched to form the gate insulation film 109. In another embodiment, a high dielectric (high-K) material having a higher dielectric constant (i.e., higher permittivity) than the $SiO_2$ film is deposited over an inner surface of the gate recess using Atomic Layer Deposition (ALD) or Chemical Vapor Deposition (CVD) to form the gate insulation film 109.

A barrier metal layer 110 is formed over the gate insulation film 109. In an embodiment, the barrier metal layer 110 is formed over the gate insulation film 109 in the recesses formed in the active region 103. Thereafter, a gate conductive material layer (not shown) is formed over the entire surface of the semiconductor substrate 100 including the recesses. Subsequently, the gate conductive material layer is planarized to expose a top surface of the hard mask pattern 108. In an embodiment, the gate conductive material layer may include any of titanium (Ti), titanium nitride (TiN), tungsten (W), or tungsten nitride (WN), or a combination thereof. In another embodiment, the gate conductive material layer includes a doped polysilicon material.

Subsequently, the planarized gate conductive material layer is selectively etched such that the gate conductive material layer remains at a lower portion of each recess to have a predetermined height, thereby forming a first gate electrode 112. In an embodiment, the gate conductive material layer may be selectively removed using an etch-back process, and the barrier metal layer 110 and the gate conductive material layer are simultaneously etched. That is, a top surface of the barrier metal layer 110 is substantially coplanar with that of the first gate electrode 112.

Referring to FIG. 2B, a sealing material layer is formed over the entire surface of a resulting structure that includes the first gate electrode 112. The sealing material layer is planarized to form a sealing film 114 until the hard mask pattern 108 is exposed. Subsequently, a portion of the sealing film 114 and a portion of the hard mask pattern 108 are etched to expose the bit-line junction region 107b in the active region 103 between the two first gate electrodes 112 in the active region 103, thereby forming a bit-line contact hole. After that, a bit-line contact layer and a bit-line conductive layer are sequentially formed over the entire surface of the resulting structure that includes the bit-line contact hole, and a mask pattern (not shown) defining a bit line is formed over the bit-line conductive layer. The bit-line conductive layer and the bit-line contact layer are etched using the mask pattern as an etch mask, such that the bit line 118 including a bit-line contact pattern 118a and a bit-line conductive pattern 118b is formed.

An interlayer insulation layer 120 is formed over the entire surface of a resulting structure including the bit line 118. The interlayer insulation layer 120 may be formed such that a top surface of the interlayer insulation layer 120 is substantially coplanar with that of a storage node contact plug to be formed in a subsequent process.

Referring to FIG. 2C, a portion of the interlayer insulation layer 120 where the storage node contact plug is to be formed is etched to form a storage node contact hole 122. The storage node contact hole 122 may be formed to expose the storage node junction region 107a of the active region 103. After formation of the storage node contact hole 122, a process for extending the size of a bottom portion of the storage node contact hole 122 may be performed.

Referring to FIG. 2D, an N-type polysilicon material fills the storage node contact hole 122 to form a preliminary storage node contact plug 123. The preliminary storage node contact plug 123 may be formed of a silicon epitaxial layer using an epitaxial growth process in which the exposed portion of the active region 103 acts as a seed, instead of filling the storage node contact hole 122 with the N-type polysilicon material. Thereafter, a planarization process (e.g., CMP process) may be performed to make heights of the preliminary storage node contact plugs 123 substantially the same.

Referring to FIG. 2E, the interlayer insulation layer 120a is etched back to expose upper portions of the preliminary storage node contact plugs 123. In an embodiment, the interlayer insulation layer 120a is etched back to form an interlayer insulation film 120b until about 40~60% of each of the preliminary storage node contact plugs 123 is exposed. The interlayer insulation layer 120a is etched by an etch-back process. Since an etch rate of the interlayer insulation layer 120a is sufficiently higher than that of the preliminary storage node contact plugs 123, the interlayer insulation layer 120a may be selectively removed by the etch-back process.

Referring to FIG. 2F, each of the exposed portions of the preliminary storage node contact plugs 123 is converted into a P-type polysilicon layer using a tilted ion implantation method. As a result, a P-type body 124b and a first N-type polysilicon layer 124a are formed.

Thereafter, referring to FIG. 2G, a gate insulation film 126 is deposited conformally along the entire surface of the resulting structure that includes the P-type bodies 124b. A barrier metal layer 128 is deposited over the gate insulation film 126.

Referring to FIG. 2H, a conductive material is deposited to cover the entire surface of the resulting structure including the gate insulation film 126 and the barrier metal layer 128. After that, a planarization process (e.g., CMP process) is performed on the deposited conductive material, the barrier metal layer 128 and the gate insulation film 126, to expose a top surface of the P-type body 124b and to form a gate conductive material layer 130.

Referring to FIG. 2I, a first mask pattern 132 exposing a center portion of the gate conductive material layer 130, which is disposed between two neighboring P-type bodies 124b, is formed. The exposed portion of the gate conductive material layer 130 is etched using the first mask pattern 132 as an etch mask to form a pair of second gate electrodes 130a that are separate from each other. In an embodiment, when the exposed portion of the gate conductive material layer 130 is etched, the barrier metal layer 128 disposed in a region corresponding to the center portion of the gate conductive material layer 130 is also removed.

Referring to FIG. 2J, after the first mask pattern 132 is removed, a second mask pattern 133 exposing portions of the barrier metal layer 128, which are disposed over the device isolation films 105, is formed. The exposed portions of the barrier metal layer 128 are selectively removed using a difference in etch rates (or etch selectivity) of the second gate electrode 130a and the barrier metal layer 128. Since the barrier metal layer 128 formed at a first side of a corresponding P-type body 124b is removed, the P-type body 124b is electrically isolated from a second gate electrode 130a disposed at the first side. On the other hand, since the barrier metal layer 128 formed at a second side of the P-type body 124 still remains, the P-type body 124b is coupled to a second gate electrode 130a disposed at the second side, which is opposite to the first side. The second gate electrode 130a coupled to the P-type body 124b is used as an auxiliary gate to suppress leakage of charges.

Referring to FIG. 2K, the second mask pattern 133 is removed, and then a second interlayer insulation film 134 is formed over the entire surface of the resulting structure. The second interlayer insulation film 134 may fill a space between the gate electrodes 130a and a portion from which the barrier metal layer 128 is removed.

Referring to FIG. 2L, the second interlayer insulation film 134 is etched to form a second interlayer insulation pattern 134a, which exposes the P-type bodies 124b.

Referring to FIG. 2M, an N-type polysilicon material is deposited over the entire surface of the resulting structure that includes the second interlayer insulation pattern 134a. Subsequently, a planarization process (such as CMP) is performed on the deposited N-type polysilicon material to expose the second interlayer insulation film pattern 134a and to form a second N-type polysilicon layer 124c over the P-type body 124. As a result, the storage node contact plug 124 is formed to have an n-p-n structure of the first N-type polysilicon layer 124a, the P-type body 124b and the second N-type polysilicon layer 124c.

Referring to FIG. 2N, a storage node 135 is formed on the second N-type polysilicon layer 124c to be coupled to the storage node contact plug 124. The storage node 135 may have a cylindrical or concave shape. However, the shape of the storage node 135 is not limited thereto, and the storage node 135 may have another shape.

Figure 3A:
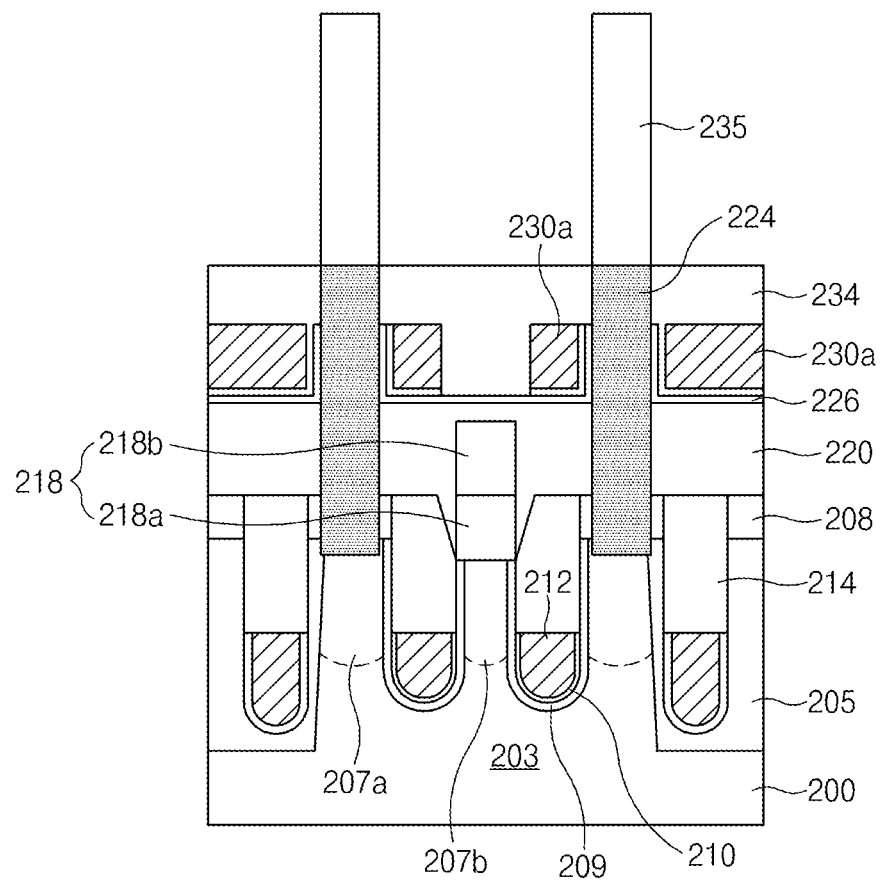
FIGS. 3A and 3B illustrate a semiconductor device according to a second embodiment of the present disclosure.
Figure 3B:
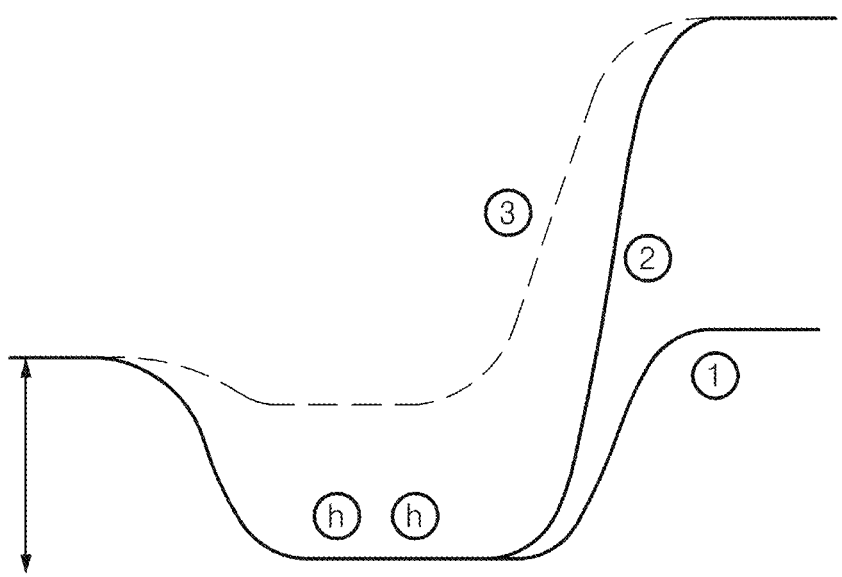

FIGS. 3A and 3B illustrate a semiconductor device according to a second embodiment of the present disclosure.

Referring to FIG. 3A, a plurality of first gate electrodes 212, a gate insulation film 209, and a barrier metal layer 210 may be buried in a semiconductor substrate 200 including an active region 203 and device isolation films 205. In an embodiment, the active region 203 may be formed of a P-type material. A pair of first gate electrodes 212 is buried in the active region 203, and one first gate electrode 212 is buried in a corresponding one of the device isolation films 205. A sealing film 214 is disposed over the first gate electrodes 212 so that the first gate electrodes 212 can be electrically isolated from each other.

A bit-line junction region 207b is disposed in an upper portion of the active region 203 between the pair of first gate electrodes 212 buried in the active region 203. A storage node junction region 207a is disposed in an upper portion of the active region 203 between each of the pair of first gate electrodes 212 and a neighboring first gate electrode 212 buried in a corresponding one of the device isolation films 205. The bit-line junction region 207b and the storage node junction regions 207a may be formed by implanting N-type impurities, which have an opposite conductive type to the P-type impurities in the active region 203, into the upper portion of the active region 203. Although the junction regions 207a and 207b of the second embodiment include the N-type impurities for convenience of description and better understanding of the present disclosure, embodiments are not limited thereto. For example, P-type impurities may be implanted to form the junction regions 207a and 207b.

In addition, a bit line 218 is formed over and coupled to the bit-line junction region 207b. The bit line 218 may have a stacked structure, which includes a bit-line contact pattern 218a and a bit-line conductive pattern 218b.

In addition, a storage node contact plug 224 is formed over and coupled to the storage node junction region 207a. The storage node contact plug 224 may include an N-type polysilicon layer or a silicon epitaxial layer.

A gate insulation film 226 and a barrier metal layer 228 are disposed at one side of the storage node contact plug 224, and a second gate electrode 230a is disposed over the barrier metal layer 228. In addition, a storage node 235 is coupled to the storage node contact plug 224. The storage node 235 may have a cylindrical or concave shape. However, the shape of the storage node 235 is not limited thereto, and the storage node 235 may have another shape.

Referring to FIG. 3B illustrating a potential distribution in the second node contact plug 224, when the second gate electrode 230a disposed over a sidewall of the N-type storage node contact plug 224 is turned off, the second node contact plug 224 has a potential distribution similar to that in the storage node contact plug 224 having the n-p-n structure as shown in FIG. 1B. Therefore, when charges stored in a cell capacitor 235 are leaked out from the cell capacitor 235, the leaked charges may be accumulated in the storage node contact plug 224 of a vertical transistor, which has floating body characteristics. During a read operation, since the accumulated charges in the storage node contact plug 224 are sensed with the remaining charges in the cell capacitor 235, a retention time of the semiconductor device according to the second embodiment may be substantially prevented from being decreased due to the leakage. As a result, the semiconductor device according to the second embodiment can have substantially the same effect as preventing the occurrence of leakage charges from the cell capacitor 235. In addition, the semiconductor device shown in FIG. 3A according to the second embodiment can be easily implemented compared to the semiconductor device shown in FIG. 1A according to the first embodiment.

FIGS. 4A to 4G are cross-sectional views illustrating a method for forming the semiconductor device shown in FIG. 3A according to an embodiment of the present disclosure.

Figure 4A:
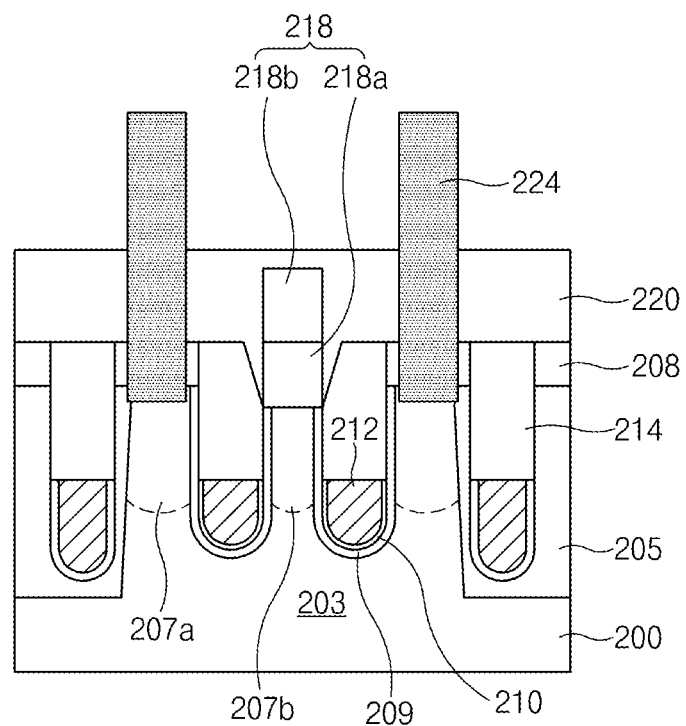
FIGS. 4A to 4G are cross-sectional views illustrating a method for forming the semiconductor device shown in FIG. 3A according to an embodiment of the present disclosure.

Referring to FIG. 4A, a first gate electrode 212, a bit line 218, and a storage node contact plug 224 are formed using the same fabrication processes as described with reference to FIGS. 2A to 2E. In this case, the storage node contact plug 224 may be formed of an N-type polysilicon layer or a silicon epitaxial layer, and an upper portion of the storage node contact plug 224 is exposed.

Figure 4B:
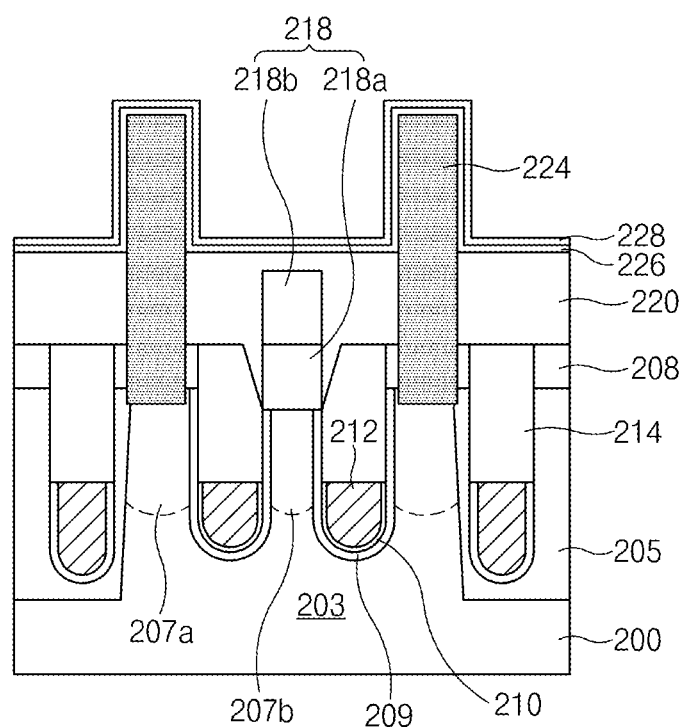

Referring to FIG. 4B, a gate insulation film 226 and a barrier metal layer 228 are sequentially formed over the exposed portion storage node contact plug 224 and a first interlayer insulation film 220.

Figure 4C:
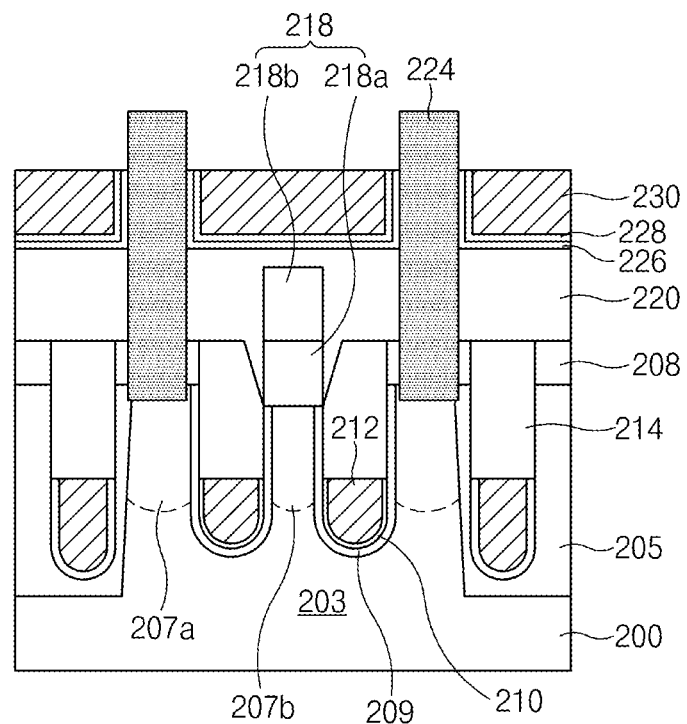

Referring to FIG. 4C, a conductive material is disposed over the entire surface of the resulting structure that includes the barrier metal layer 228. Thereafter, an etch-back process is performed on the deposited conductive material, the gate insulation film 226 and the barrier metal layer 228 until a part of the upper portion of the storage node contact plug 224 is exposed. As a result, a gate conductive material layer 230 is formed. When the deposited gate conductive material is etched back, the gate insulation film 226 and the barrier metal layer 228 are also etched.

Figure 4D:
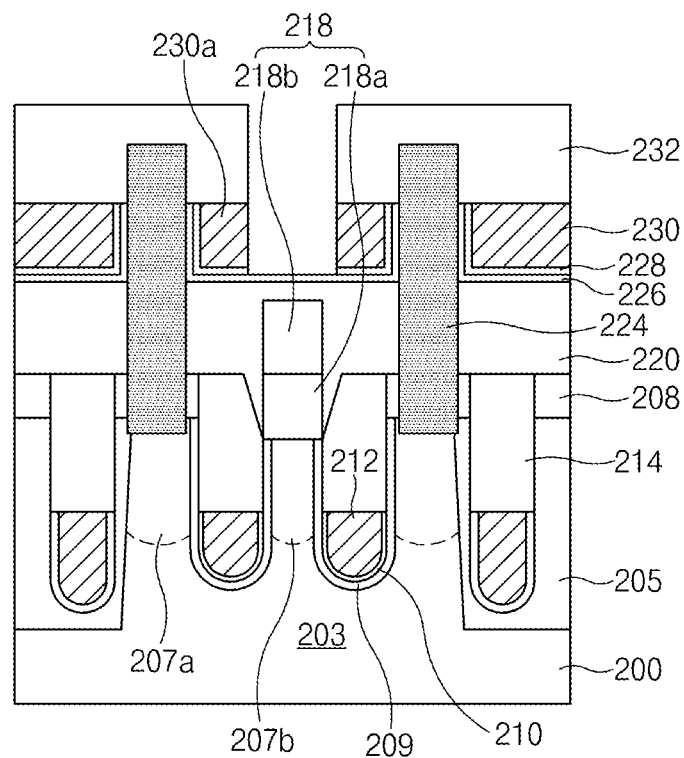

Thereafter, referring to FIG. 4D, a first mask pattern 232 exposing a center portion of the gate conductive material layer 230, which is disposed between a pair of neighboring storage node contact plugs 224, is formed. The exposed portion of the gate conductive material layer 230 is etched using the first mask pattern 232 as an etch mask to form second gate electrodes 230a, which are separate from each other.

Figure 4E:
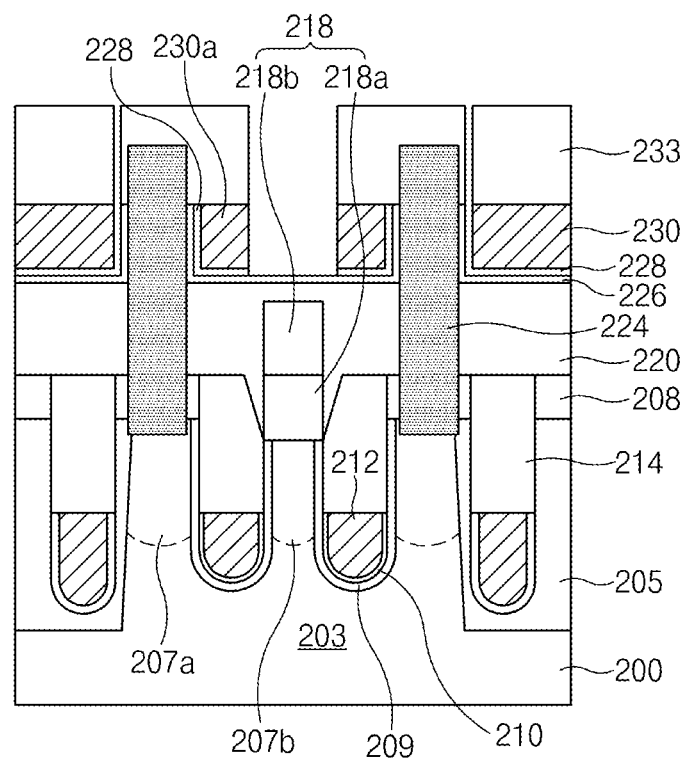

Referring to FIG. 4E, after the first mask pattern 232 is removed, a second mask pattern 233 exposing portions of the barrier metal layer 228 disposed over the device isolation films 205 is formed. The exposed portions of the barrier metal layer 228 may be selectively removed using a difference in etch rates (or etch selectivity) between the gate conductive material layer 230 and the barrier metal layer 228. Since the barrier metal layer 228 that is formed at a first side of a corresponding storage node contact plug 224 is removed, the storage node contact plug 244 is isolated from the gate conductive material layer 230 disposed at the first side of the storage node contact plug 224. On the other hand, since the barrier metal layer 228 that is formed at a second side of the storage node contact plug 224 still remains, the storage node contact plug 224 is coupled to the second gate electrode 230a disposed at the second side, which is opposite to the first side. The second gate electrode 230a disposed at the second side is used as an auxiliary gate to suppress leakage of charges.

Figure 4F:
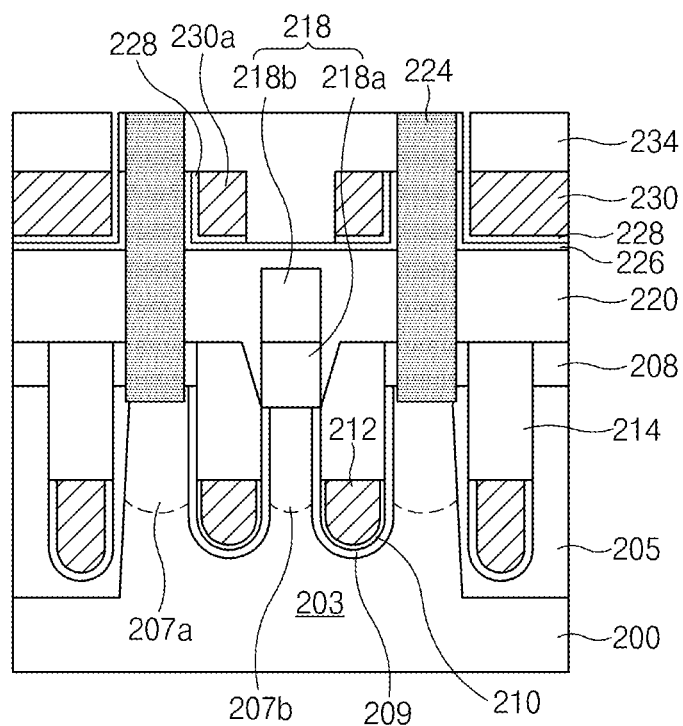

Referring to FIG. 4F, the second mask pattern 233 is removed and then a second interlayer insulation film 234 is formed over the entire surface of the resulting structure. The second interlayer insulation film 234 may fill a space between the gate electrodes 230a and a portion from which the barrier metal layer 228 is removed.

Figure 4G:
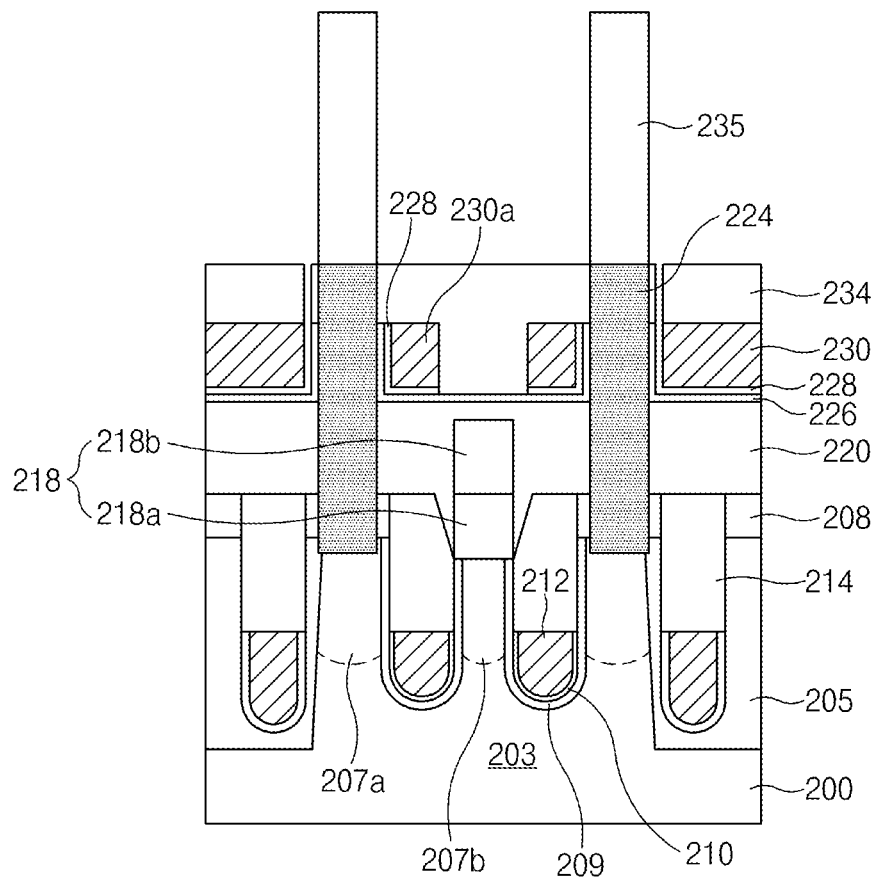

Referring to FIG. 4G, the storage node 235 coupled to the storage node contact plug 224 is formed. The storage node 235 may have a cylindrical or concave shape. However, the shape of the storage node 235 is not limited thereto, and the storage node 235 may have another shape.

Figure 5:
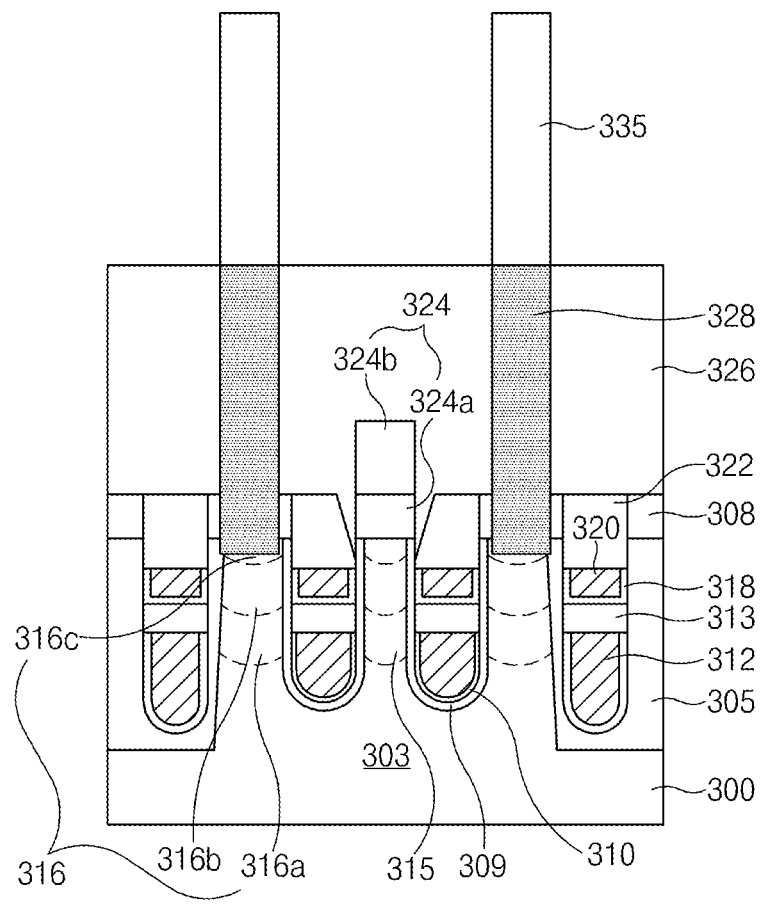
FIG. 5 is a cross-sectional view illustrating a semiconductor device according to a third embodiment of the present disclosure.

FIG. 5 is a cross-sectional view illustrating a semiconductor device according to a third embodiment of the present disclosure.

Referring to FIG. 5, a plurality of first gate electrodes 312, a gate insulation film 309, and a barrier metal layer 310 may be buried in a semiconductor substrate 300 including an active region 303 and device isolation films 305. In an embodiment, the active region 303 may be formed of a P-type material. Two first gate electrodes 312 are buried in the active region 303, and one first gate electrode 312 is buried in each of the device isolation films 305. An insulation film pattern 313 is disposed over the first gate electrode 312, and a second gate electrode 320 is disposed over the insulation film pattern 313. The first gate electrodes 312 and the second gate electrodes 320 are buried in the semiconductor substrate 300, and one of the first gate electrodes 312 and a corresponding one of the second gate electrodes 320 may be electrically isolated from each other by the insulation film pattern 313. In addition, a sealing film 322 is disposed over the second gate electrode 320, so that a first pair of the one of the first gate electrodes 312 and the corresponding one of the second gate electrodes 320 can be electrically isolated from a second pair adjacent to the first pair.

A bit-line junction region 315 is disposed in an upper portion of the active region 303 between the two first gate electrodes 312 buried in the active region 303. A storage node junction region 316 is disposed in an upper portion of the active region 303 between each of the two first gate electrodes 312 buried in the active region 303 and a neighboring first gate electrode 312 buried in a corresponding one of the device isolation films 305. The bit-line junction region 315 may be formed by implanting N-type impurities, which have an opposite conductive type to the P-type impurities in the active region 303. In an embodiment, the storage node junction region 316 may have an n-p-n junction region in which a first N-type junction region 316a, a P-type junction region 316b, and a second N-type junction region 316c are sequentially stacked. A sidewall of the first N-type junction region 316a overlaps with a sidewall of the insulation film pattern 313, and a sidewall of the P-type junction region 316b overlaps with a sidewall of the second gate electrode 320.

Although the bit-line junction region 315 shown in FIG. 5 also has an n-p-n structure as an example, embodiments are not limited thereto, and the bit-line junction region 315 may have an N-type junction region only.

In addition, a bit line 324 is formed over and coupled to the bit-line junction region 315. The bit line 324 may include a bit-line contact pattern 324a and a bit-line conductive pattern 324b.

In addition, a storage node contact plug 328 is formed over and coupled to the storage node junction region 316. The storage node contact plug 328 may include an N-type polysilicon layer or a silicon epitaxial layer. In addition, a storage node 335 is coupled to the storage node contact plug 328. The storage node 335 may have a cylindrical or concave shape. However, the shape of the storage node 335 is not limited thereto, and the storage node 335 may have another shape.

In this embodiment, the n-p-n type storage node junction region 316 and the second gate electrode 320 act as a vertical transistor.

Therefore, when charges stored in a cell capacitor 335 are leaked out from the cell capacitor 335, the leaked charges may be accumulated in the P-type junction region 316b of the vertical transistor having floating body characteristics. During a read operation, since the charges accumulated in the P-type junction region 316b of the storage node junction region 316 are sensed with the remaining charges in the cell capacitor 335, a retention time of the semiconductor device according to the third embodiment may not be significantly decreased due to the leakage of charges. As a result, the semiconductor device according to the third embodiment can have the substantially same effect as preventing the occurrence of leakage charges from the cell capacitor 335.

FIGS. 6A to 6G are cross-sectional views illustrating a method for forming the semiconductor device shown in FIG. 5 according to an embodiment of the present disclosure.

Figure 6A:
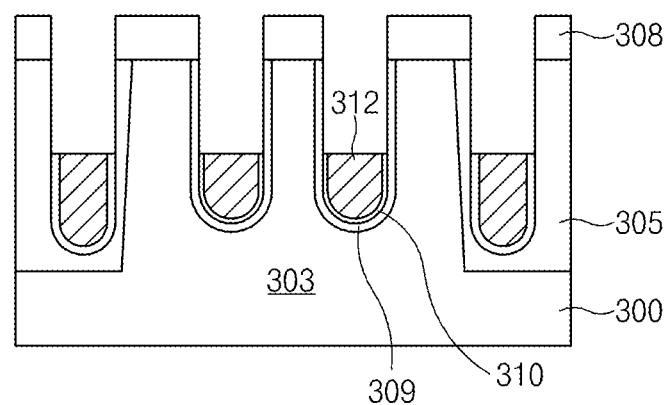
FIGS. 6A to 6G are cross-sectional views illustrating a method for forming the semiconductor device shown in FIG. 5 according to an embodiment of the present disclosure.

Referring to FIG. 6A, a mask pattern 308 defining a gate region is formed over a semiconductor substrate 300 including an active region 303 and device isolation films 305. The semiconductor substrate 300 is etched using the mask pattern 308 as an etch mask, to form a plurality of recesses. In an embodiment, two recesses may be formed in the active region 303, and one recess may be formed in each device isolation film 305.

Thereafter, a gate insulation film 309 and a barrier metal layer 310 are formed over the recesses. Thereafter, after a gate conductive material layer is formed over the entire surface of the resulting structure that includes the barrier metal layer 310, the gate conductive material layer is etched back and remains at a lower portion of the recesses to form first gate electrodes 312. In an embodiment, during the etch-back process, the barrier metal layer 310 is also etched.

Figure 6B:
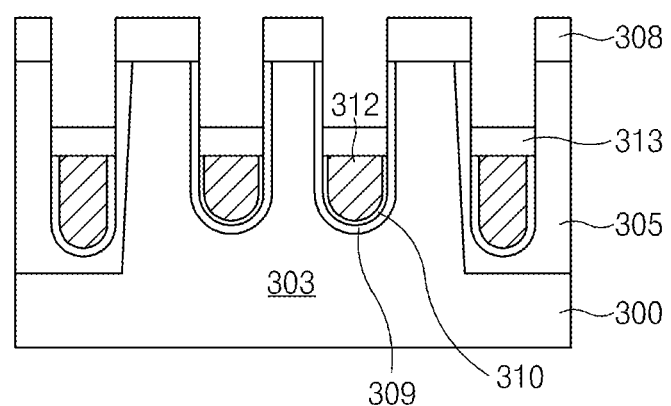

Referring to FIG. 6B, an insulation film 313 having a predetermined thickness is formed over the first gate electrode 312 disposed in each recess. The insulation film 313 may be sufficiently thick to electrically isolate the first gate electrode 312 from a gate electrode to be formed in a subsequent process.

Figure 6C:
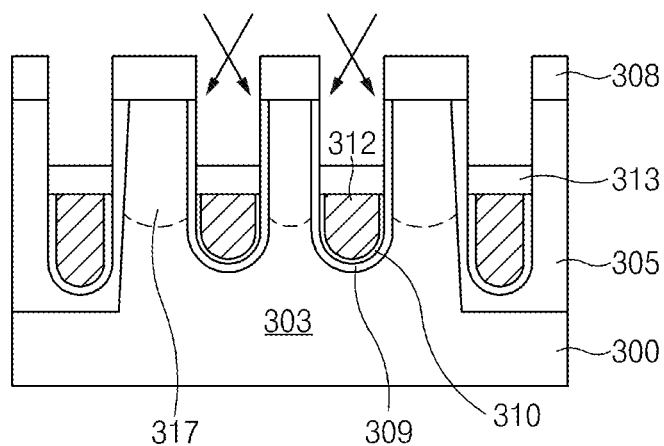

Referring to FIG. 6C, a tilted ion implantation process is performed on upper portions of the active region 303 to form a preliminary N-type junction region 317.

Figure 6D:
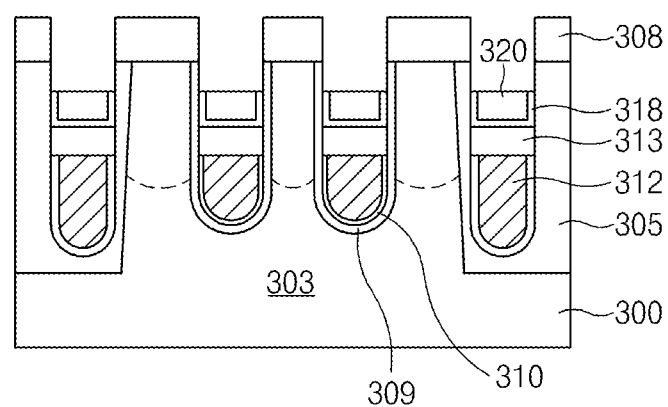

Referring to FIG. 6D, a barrier metal material layer is formed over the entire surface of the resulting structure that includes the insulation film 313, and a gate conductive material layer is formed over the barrier metal material layer. Thereafter, by performing an etch-back process on the gate conductive material layer and the barrier metal material layer, a second gate electrode 320 is formed over the insulation film 313. In the etch-back process, the barrier metal material layer may be etched simultaneously with the gate conductive material layer to form a barrier metal layer 318.

Figure 6E:
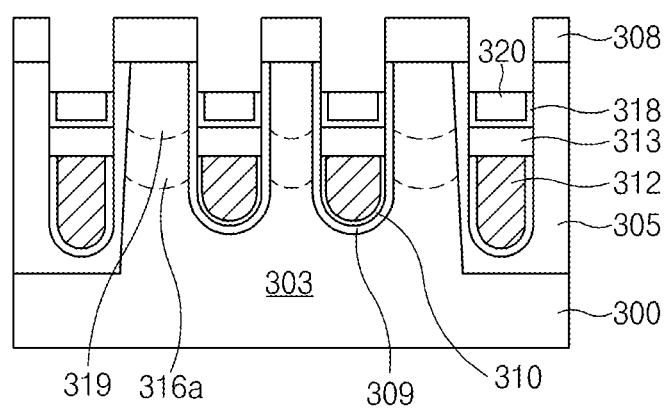

Referring to FIG. 6E, a titled ion implantation process is performed on an upper portion of the active region 303 to form a preliminary P-type junction region 319.

In an embodiment, the ion implantation process for forming the preliminary P-type junction region 319 may be performed in a manner that the preliminary P-type junction region 319 is formed in an upper portion of the preliminary N-type junction region 317. As a result, a first N-type junction region 316a that corresponds to a lower portion of the preliminary N-type junction region 317 is formed. The preliminary P-type junction region 319 is formed to have a predetermined depth such that a sidewall of the preliminary P-type junction region 319 overlaps with a sidewall of the second gate electrode 320. In an embodiment, the ion implantation process for forming the preliminary P-type junction region 319 converts the upper portion of the preliminary N-type junction region 317 into the preliminary P-type junction region 319. Thus, it is preferable that the ion implantation process of forming the preliminary P-type junction region 319 is performed using impurities having an ion density higher than that used in the previous ion implantation process of forming the preliminary N-type junction region 317.

Figure 6F:
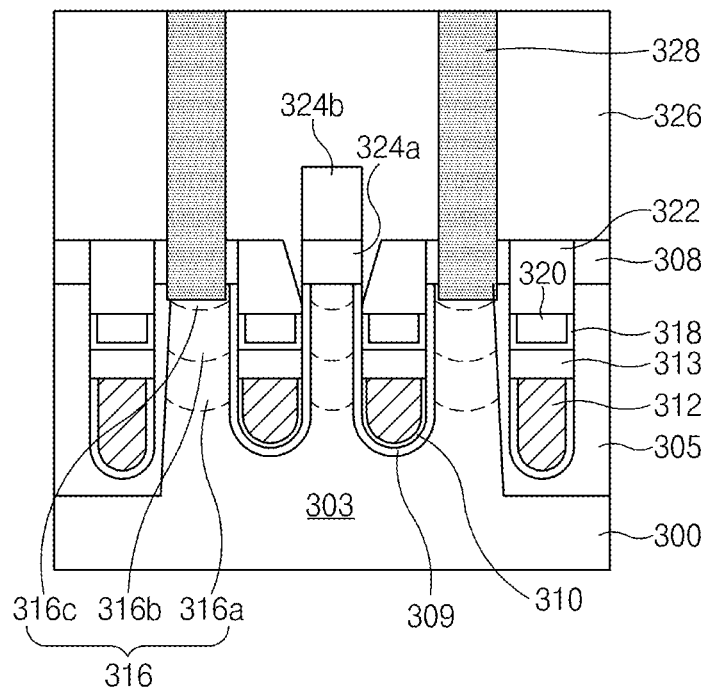

Referring to FIG. 6F, a sealing material layer is formed over the entire surface of the resulting structure including the preliminary P-type junction region 319, so that the second gate electrodes 320 are isolated from each other. The sealing material layer is planarized using, e.g., a CMP process, until the hard mask pattern 308 is exposed. As a result, a sealing film 322 is formed over each of the second gate electrodes 320.

After that, the sealing film 322 and the hard mask pattern 308 are etched to expose the active region 303 between the second gate electrodes 320 disposed over two first gate electrodes 312 in the active region 303, respectively, and thus to form a bit-line contact hole. Subsequently, a bit-line contact material layer and a bit-line conductive material layer are sequentially formed over the entire surface of the resulting structure that includes the bit-line contact hole, and a mask pattern (not shown) for defining a bit line is formed over the bit-line conductive material layer. The bit-line conductive material layer and the bit-line contact material layer are etched using the mask pattern as an etch mask to form a bit-line contact pattern 324a and a bit-line conductive pattern 324b of a bit line 324.

Subsequently, an interlayer insulation material layer is formed over the entire surface of the resulting structure that includes the bit line 324. The interlayer insulation material layer may be formed such that a top surface of the interlayer insulation material layer is substantially coplanar with that of a storage node contact plug to be formed in a subsequent process.

Thereafter, a portion of the interlayer insulation material layer, which is reserved for the storage node contact plug, and the mask pattern 308 are etched until the preliminary P-type junction region 319 is exposed. As a result, a storage node contact hole is formed. An N-type polysilicon layer is buried in the storage node contact hole to form a storage node contact plug 328. N-type impurities included in the storage node contact plug 328 are diffused into an upper portion of the preliminary P-type junction region 319. Thus, a second N-type junction region 316c is formed at the upper portion of the preliminary P-type junction region 319, and the remaining portion of the preliminary P-type junction region 319 corresponds to a P-type junction region 316b. Accordingly, the second N-type junction region 316c is disposed over the P-type junction region 316b. As a result, the n-p-n type storage node junction region 316 including the first N-type junction region 316a, the P-type junction region 316b, and the N-type junction region 316c is formed in the active region 303.

Figure 6G:
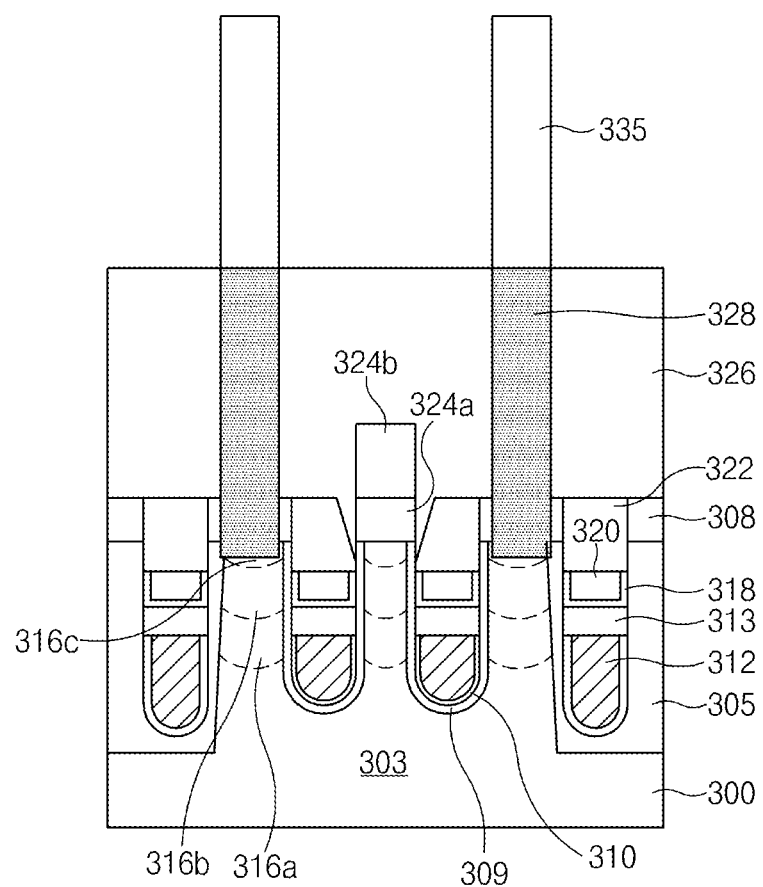

Referring to FIG. 6G, a storage node 335 coupled to the storage node contact plug 328 is formed. The storage node 335 may have a cylindrical or concave shape. However, the shape of the storage node 335 is not limited thereto, and the storage node 335 may have another shape.

Figure 7:
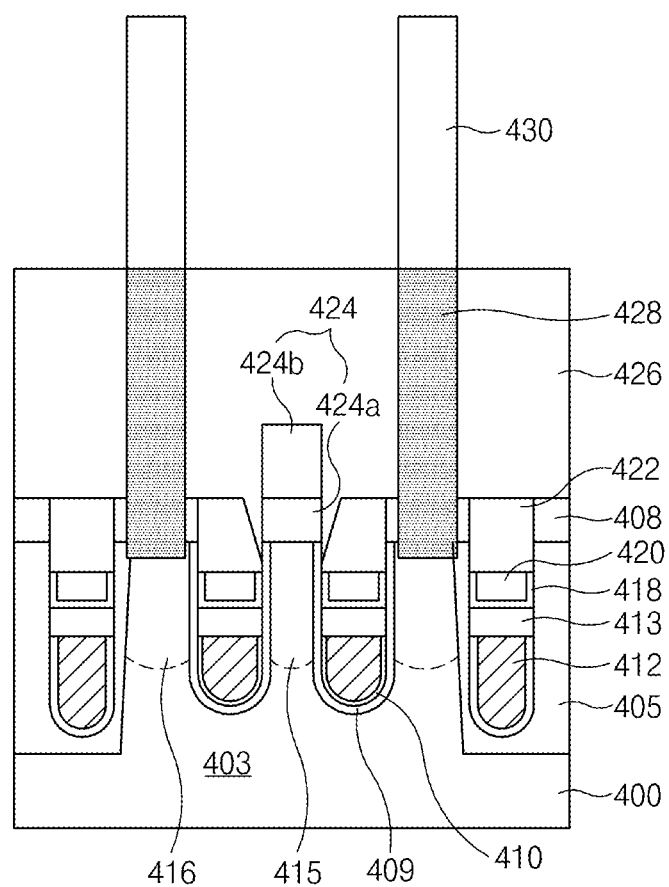
FIG. 7 is a cross-sectional view illustrating a semiconductor device according to a fourth embodiment of the present disclosure.

FIG. 7 is a cross-sectional view illustrating a semiconductor device according to a fourth embodiment of the present disclosure.

Referring to FIG. 7, a plurality of first gate electrodes 412, a gate insulation film 409, and a barrier metal layer 410 may be buried in a semiconductor substrate 400 including an active region 403 and device isolation films 405. In an embodiment, the active region 403 may be formed of a P-type material. A pair of first gate electrodes 412 is buried in the active region 403, and one first gate electrode 412 is buried in each of the device isolation films 405. An insulation film pattern 413 is disposed over the first gate electrode 412, and a second gate electrode 420 is disposed over the insulation film pattern 413. The first gate electrodes 412 and the second gate electrodes 420 may be buried in the semiconductor substrate 400, and one of the first gate electrodes 412 and a corresponding one of the second gate electrodes 420 may be electrically isolated from each other by the insulation film pattern 413. In addition, a sealing film 422 is disposed over the second gate electrodes 420, so that a first pair of one of the first gate electrodes 412 and a corresponding one of the second gate electrodes 420 can be electrically isolated from a second pair adjacent to the first pair.

A bit-line junction region 415 is disposed in an upper portion of the active region 403 between the pair of first gate electrodes 412 buried in the active region 403. A storage node junction region 416 is disposed in an upper portion of the active region 403 between each of the pair of first gate electrodes 412 buried in the active region 403 and a neighboring first gate electrode 412 buried in a corresponding one of the device isolation films 405. In an embodiment, the bit-line junction region 415 and the storage node junction region 416 may include an N-type junction region.

A bit line 424 is formed over and coupled to the bit-line junction region 415. The bit line 424 may include a stacked structure of a bit-line contact pattern 424a and a bit-line conductive pattern 424b.

In addition, a storage node contact plug 428 is formed over and coupled to the storage node junction region 416. The storage node contact plug 428 may include an N-type polysilicon layer or a silicon epitaxial layer. A storage node 430 is coupled to the storage node contact plug 428. The storage node 430 may have a cylindrical or concave shape. However, the shape of the storage node 430 is not limited thereto, and the storage node 430 may have another shape When the storage node junction region 416 includes the N-type junction region and the second gate electrode 420 including a sidewall overlapping with a sidewall of the N-type junction region 416 is turned off, the storage node junction region 416 has a potential distribution similar to that of the n-p-n structure (e.g., the storage node contact plug 124 or 224 of FIG. 1A or FIG. 3A), as shown in FIGS. 1B and 3B.

Therefore, when charges stored in a cell capacitor 430 are leaked out from the cell capacitor 430, the leaked charges may be accumulated in the storage node junction region 416. As a result, the semiconductor device according to the fourth embodiment can have substantially the same effect as preventing the occurrence of leakage charges from the cell capacitor 430.

Figure 8A:
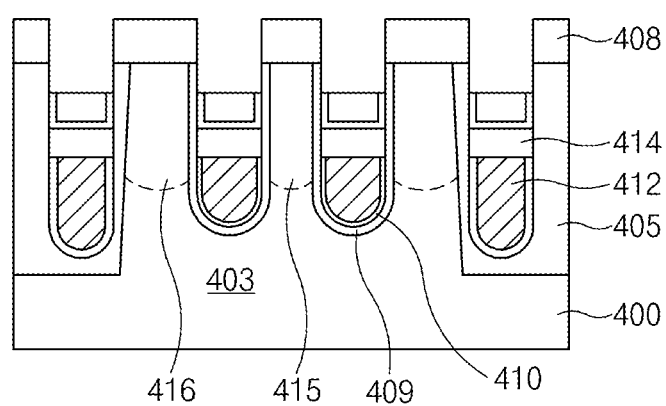
FIGS. 8A to 8C are cross-sectional views illustrating a method for forming the semiconductor device shown in FIG. 7 according to an embodiment of the present disclosure.
Figure 8B:
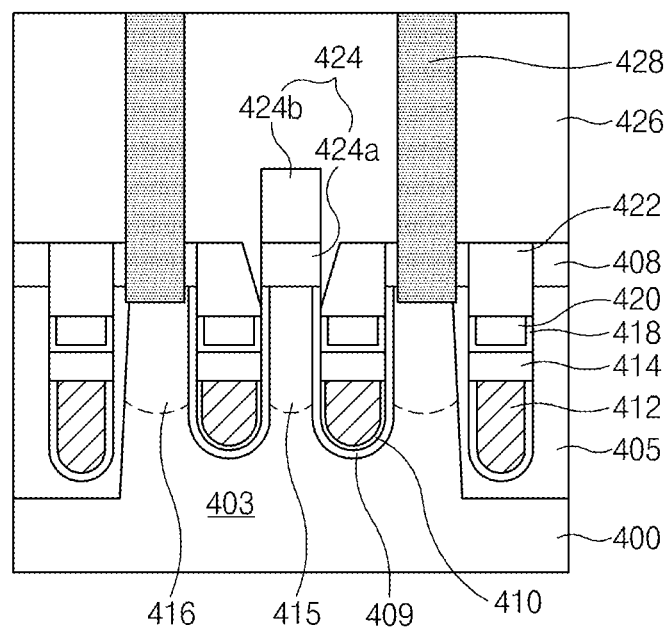
Figure 8C:
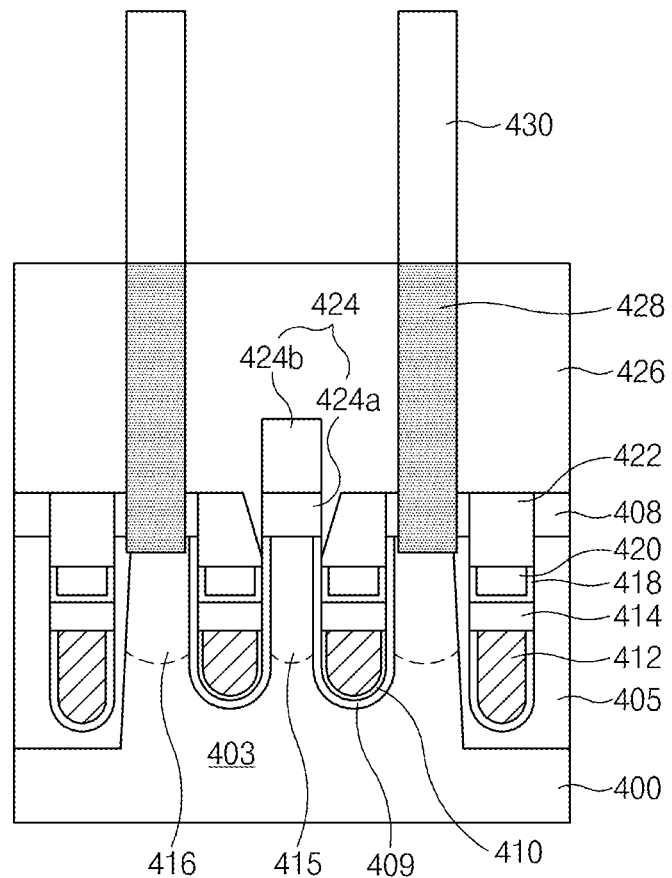

FIGS. 8A to 8C are cross-sectional views illustrating a method for forming the semiconductor device shown in FIG. 7 according to an embodiment of the present disclosure.

Referring to FIG. 8A, a first gate electrode 412, a bit-line junction region 415, a storage node junction region 416, an insulation film pattern 414, and a second gate electrode 420 are formed using the same fabrication processes as described with reference to in FIGS. 6A to 6D. After that, a sealing material layer is formed over the entire surface of the resulting structure that includes the second gate electrode 420, so that the second gate electrodes 420 are isolated from each other. The sealing material layer is planarized using, e.g., a CMP process, until a hard mask pattern 408 used to form the first and second gate electrodes 412 and 420 is exposed, thereby forming a sealing film 422 disposed over each of the second gate electrodes 420.

Referring to FIG. 8B, the sealing film 422 and the hard mask pattern 408 are etched to expose the active region 403 between the second gate electrodes 420 disposed over two first gate electrodes 412 in the active region 403, respectively, and thus to form a bit-line contact hole. Subsequently, a bit-line contact material layer and a bit-line conductive material layer are sequentially formed over the entire surface of the resulting structure that includes the bit-line contact hole, and a mask pattern (not shown) for defining a bit line is formed over the bit-line conductive material layer. The bit-line conductive material layer and the bit-line contact material layer are etched using the mask pattern as an etch mask to form a bit-line contact pattern 424a and a bit-line conductive pattern 424b included in a bit line 424.

Subsequently, an interlayer insulation material layer is formed over the entire surface of the resulting structure that includes the bit line 424. The interlayer insulation material layer may be formed such that a top surface of the interlayer insulation material layer is substantially coplanar with that of a storage node contact plug to be formed in a subsequent process.

Thereafter, a portion of the interlayer insulation material layer is etched to form a storage node contact hole, and N-type polysilicon is buried in the storage node contact hole to form a storage node contact plug 428 and an interlayer insulation film 426.

Referring to FIG. 8C, a storage node 430 coupled to the storage node contact plug 428 is formed. The storage node 430 may have a cylindrical or concave shape. However, the shape of the storage node 430 is not limited thereto, and the storage node 430 may have another shape.

In embodiments, a semiconductor device includes a vertical transistor structure having floating body characteristics, and thus charges leaked from a storage node can be stored in the vertical transistor structure of the semiconductor device. As a result, refresh characteristics in the embodiments may be substantially improved even though cell capacitance is reduced due to the reduction of a cell size of the semiconductor device.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

Various alternatives and equivalents are possible. Embodiments are not limited by the type of deposition, etching polishing, and patterning steps described herein. Nor are embodiments limited to any specific type of semiconductor devices. For example, embodiments may be implemented in a volatile memory device, such as a dynamic random access memory (DRAM) device, or a non-volatile memory device. Other additions, subtractions, or modifications are obvious in view of the present disclosure and are intended to fall within the scope of the appended claims.

What is claimed is:

1. A semiconductor device comprising:
   a plurality of first gate electrodes buried in a semiconductor substrate including an active region and a device isolation film;
   a plurality of junction regions, each of the plurality of junction regions disposed in a portion of the active region between two adjacent first gate electrodes, the plurality of junction regions including storage node junction regions and a bit line junction region disposed between the storage node junction regions;
   a plurality of storage node contact plugs disposed over and coupled to the storage node junction regions, respectively;
   a plurality of storage nodes coupled to and disposed over the plurality of storage node contact plugs, respectively; and
   a second gate electrode disposed over a sidewall of a corresponding one of the plurality of storage node contact plugs,
   wherein a vertical transistor includes the second gate electrode and the corresponding one of the plurality of storage node contact plugs and stores charges leaked from a corresponding one of the plurality of storage nodes.

2. The semiconductor device according to claim 1, wherein a sidewall of a junction region partially overlaps with a sidewall of a corresponding one of the plurality of first gate electrodes.

3. The semiconductor device according to claim 1, wherein the plurality of junction regions include N-type impurities.

4. The semiconductor device according to claim 1, wherein the plurality of first gate electrodes and the second gate electrode each include a gate insulation film and a barrier metal layer.

5. The semiconductor device according to claim 1, wherein the plurality of storage node contact plugs include an N-type polysilicon layer, a silicon epitaxial layer, or both.

6. The semiconductor device according to claim 1, wherein each of the plurality of storage node contact plugs includes an n-p-n structure in which a first N-type layer, a P-type body, and a second N-type layer are disposed.

7. The semiconductor device according to claim 6, wherein the P-type body is disposed between the first and second N-type layers and includes P-type impurities.

8. The semiconductor device according to claim 6, wherein the second gate electrode is disposed over a first sidewall of the P-type body of the n-p-n structure.

9. The semiconductor device according to claim 1, wherein the plurality of storage node contact plugs include:
   a first storage node contact plug coupled to a first one of the storage node junction regions; and
   a second storage node contact plug coupled to a second one of the storage node junction regions, and
   wherein the second gate electrode disposed over a sidewall of the first storage node contact plug is isolated from the second gate electrode disposed over a sidewall of the second storage node contact plug.

10. The semiconductor device according to claim 1, further comprising:
    a bit line coupled to the bit line junction region and including a bit-line contact pattern and a bit-line conductive pattern that are sequentially stacked over the bit line junction region.

11. A semiconductor device comprising:
    a plurality of first gate electrodes buried in a semiconductor substrate including an active region and a device isolation film;
    a plurality of junction regions, each of the plurality of junction regions disposed in a portion of the active region between two adjacent first gate electrodes, the plurality of junction regions including storage node junction regions and a bit line junction region disposed between the storage node junction regions;
    a plurality of storage node contact plugs disposed over and coupled to the storage node junction regions, respectively;
    a plurality of storage nodes coupled to and disposed over the pluralitystorage node contact plugs, respectively; and
    a plurality of second gate electrodes disposed over the plurality of first gate electrodes, respectively, and configured to prevent leakage charges of the plurality of storage nodes disposed in the active region,
    wherein each of the plurality of first gate electrodes and a corresponding one of the plurality of second gate electrodes are isolated from each other by an insulation film pattern.

12. The semiconductor device according to claim 11, wherein the plurality of junction regions include N-type impurities.

13. The semiconductor device according to claim 11, wherein each of the plurality of junction regions includes an n-p-n structure in which a first N-type junction region, a P-type junction region, and a second N-type junction region are disposed.

14. The semiconductor device according to claim 13, wherein the P-type junction region is disposed between the first and second N-type junction regions and includes P-type impurities.

15. The semiconductor device according to claim 13, wherein a sidewall of the first N-type junction region overlaps with a sidewall of the insulation film pattern.

16. The semiconductor device according to claim 13, wherein a sidewall of the P-type junction region overlaps with a sidewall of the second gate electrode.

17. The semiconductor device according to claim 11, wherein each of the plurality of first gate electrodes and each of the plurality of second gate electrodes include a gate insulation film and a barrier metal layer.

18. The semiconductor device according to claim 11, wherein the plurality of storage node contact plugs include an N-type polysilicon layer.

19. The semiconductor device according to claim 11, wherein the semiconductor device further comprises:
- a bit line coupled to the bit line junction region and including a bit-line contact pattern and a bit-line conductive pattern that are sequentially stacked over the bit line junction region.

20. A semiconductor device comprising:
- two adjacent first gate electrodes, one of the first gate electrodes buried in an active region and the other one of the first gate electrodes buried in a device isolation film defining the active region in a semiconductor substrate;
- a storage node contact junction region disposed in a portion of the active region that is disposed between the two adjacent first gate electrodes;
- a storage node contact plug disposed over the storage node contact junction region and including a first N-type pattern, a P-type body, and a second N-type pattern;
- a storage node disposed over the storage node contact plug; and
- a second gate electrode disposed over a sidewall of the P-type body.

* * * * *